(12) United States Patent
Shishido et al.

(10) Patent No.: US 12,193,245 B2
(45) Date of Patent: Jan. 7, 2025

(54) IMAGING DEVICE

(71) Applicant: Panasonic Intellectual Property Management Co., Ltd., Osaka (JP)

(72) Inventors: Sanshiro Shishido, Osaka (JP); Yasuo Miyake, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 530 days.

(21) Appl. No.: 17/396,640

(22) Filed: Aug. 6, 2021

(65) Prior Publication Data

US 2021/0375998 A1 Dec. 2, 2021

Related U.S. Application Data

(63) Continuation of application No. PCT/JP2020/012318, filed on Mar. 19, 2020.

(30) Foreign Application Priority Data

May 7, 2019 (JP) ................................ 2019-087777

(51) Int. Cl.
  *H10K 39/32* (2023.01)
  *H10K 85/20* (2023.01)

(52) U.S. Cl.
  CPC ........... *H10K 39/32* (2023.02); *H10K 85/221* (2023.02)

(58) Field of Classification Search
  CPC ....... H01L 33/62; H01L 27/156; H01L 33/10; H01L 33/46; H01L 33/405; H01L 27/146;
  (Continued)

(56) References Cited

U.S. PATENT DOCUMENTS

2008/0283883 A1* 11/2008 Shim .................. B82Y 10/00
                                                    257/292
2013/0048866 A1*  2/2013 Nishino ................ G01T 1/202
                                                    250/366
2018/0047788 A1   2/2018 Nozawa

FOREIGN PATENT DOCUMENTS

JP       5-167056       7/1993
JP     2003-234460       8/2003
(Continued)

OTHER PUBLICATIONS

International Search Report of PCT application No. PCT/JP2020/012318 dated Jun. 16, 2020.

*Primary Examiner* — Thanh T Nguyen
(74) *Attorney, Agent, or Firm* — Rimon P.C.

(57) ABSTRACT

An imaging device includes pixels. Each of the pixels includes a counter electrode, a pixel electrode, and a photoelectric conversion layer that includes carbon nanotubes. The pixels include a first pixel and a second pixel adjacent to the first pixel. The pixel electrode of the first pixel and the pixel electrode of the second pixel are isolated from each other. Carbon nanotubes included in the photoelectric conversion layer in at least one selected from the group consisting of the first pixel and the second pixel include at least one first carbon nanotube that satisfies A<B, where A denotes length of a carbon nanotube in a direction in which the pixel electrode of the first pixel and the pixel electrode of the second pixel are arranged and B denotes length of a gap between the pixel electrode of the first pixel and the pixel electrode of the second pixel.

12 Claims, 14 Drawing Sheets

(58) Field of Classification Search
CPC ...... H01L 31/10; H10K 39/32; H10K 85/221; B82Y 30/00
See application file for complete search history.

(56) References Cited

FOREIGN PATENT DOCUMENTS

| | | |
|---|---|---|
| JP | 2008-053252 | 3/2008 |
| JP | 2008-288585 | 11/2008 |
| JP | 2017-201695 A | 11/2017 |
| WO | 2017/006520 | 1/2017 |

\* cited by examiner

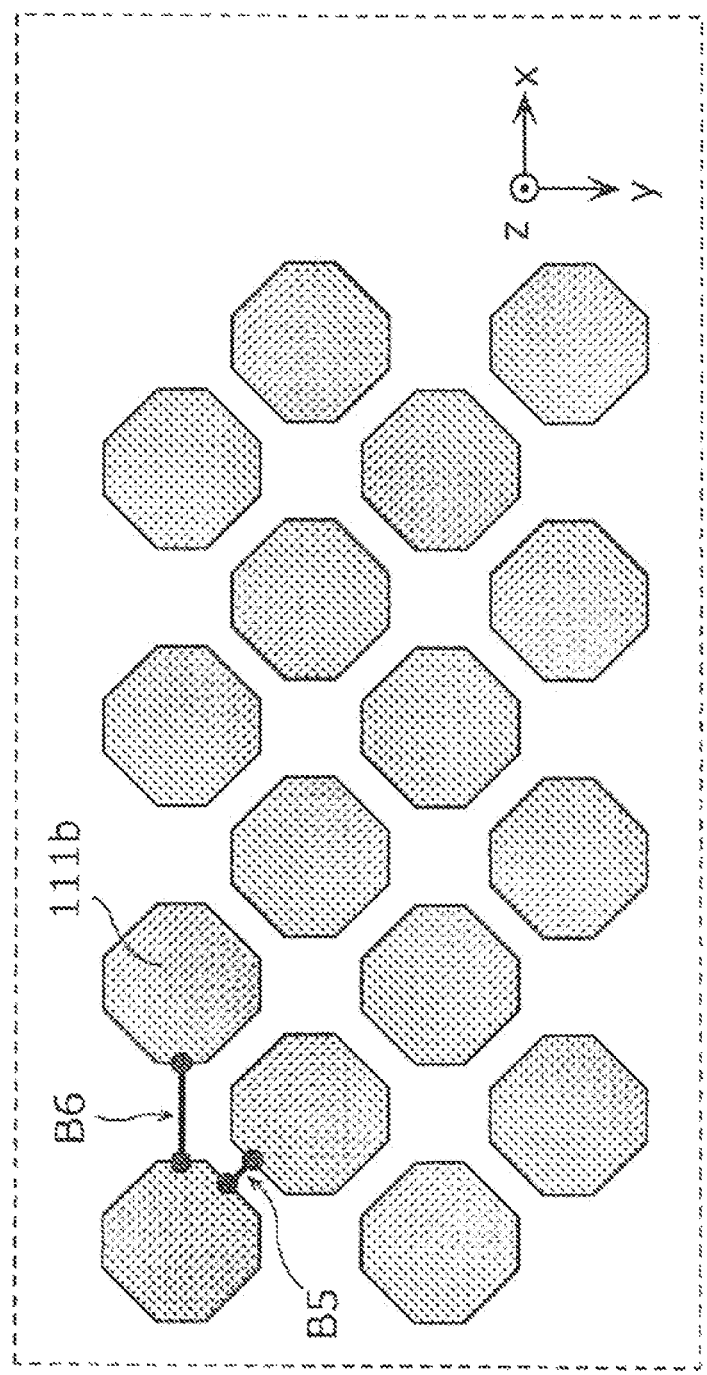

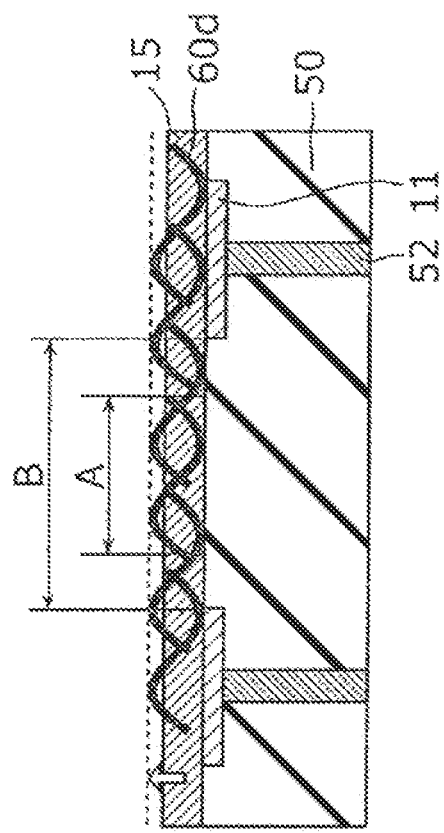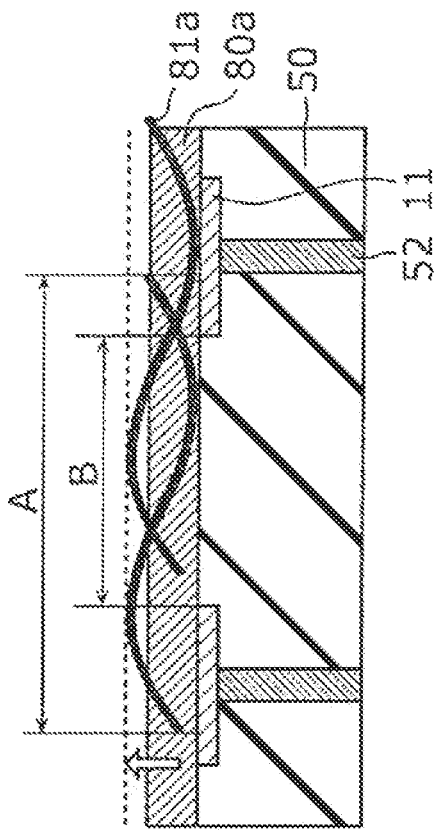

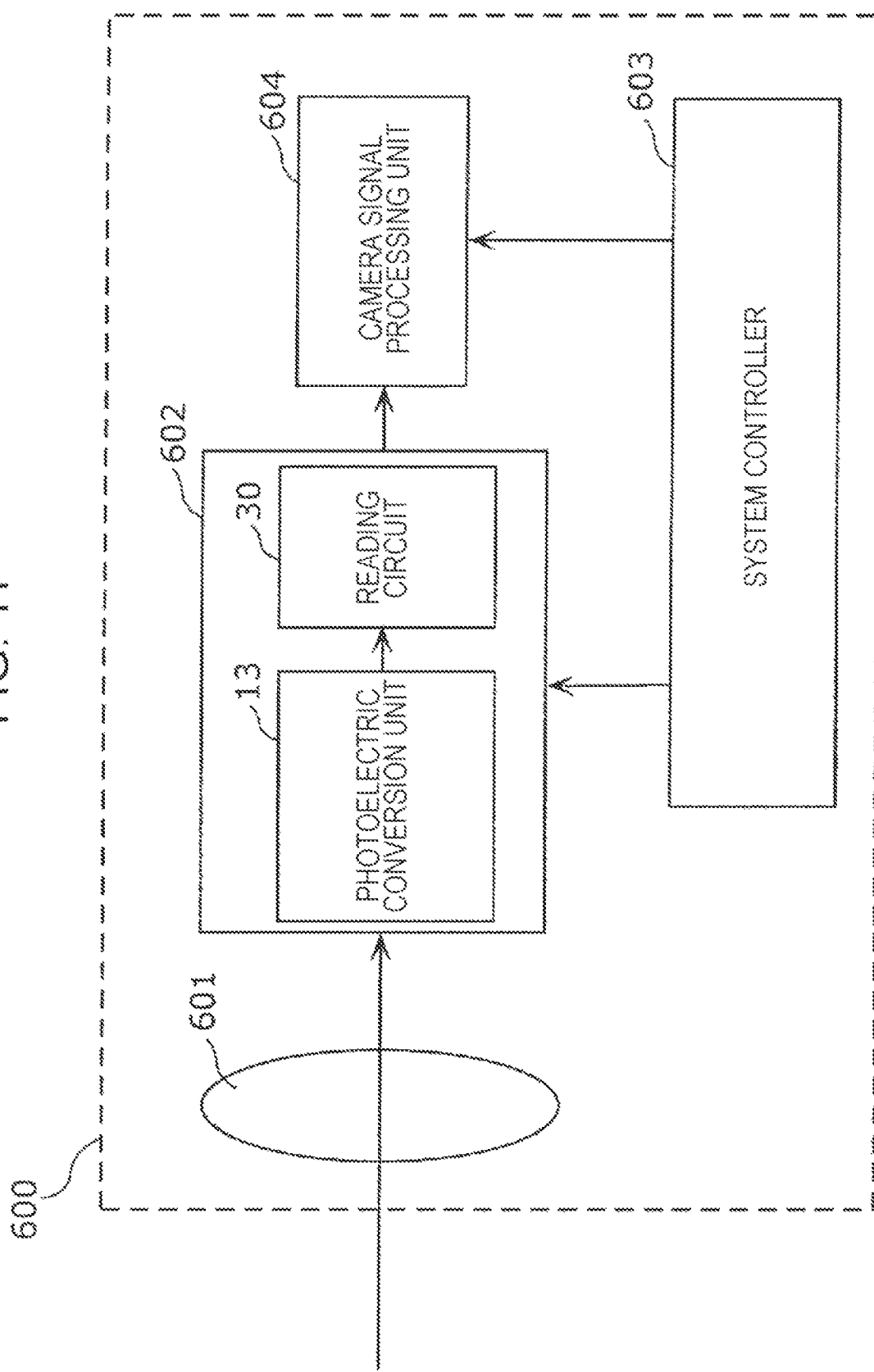

IMAGING DEVICE

BACKGROUND

1. Technical Field

The present disclosure relates to an imaging device.

2. Description of the Related Art

During these years, multilayer imaging devices in which photoelectric conversion elements are provided on a semiconductor substrate are being achieved. In a multilayer imaging device, a photoelectric conversion layer of photoelectric conversion elements can be composed of a material different from one used for a semiconductor substrate. The photoelectric conversion layer, therefore, can be composed of an inorganic material or an organic material different from a conventional semiconductor material such as silicon. As a result, imaging devices having physical properties or functions different from those of conventional imaging devices, such as sensitivity in a wavelength band different from ones in the case of conventional imaging devices, have been achieved. For example, Japanese Unexamined Patent Application Publication No. 2003-234460 discloses an imaging device having a high level of use efficiency of light because of two or more photoelectric conversion layers that are included in the imaging device and that have sensitivity in different wavelength bands. Japanese Patent No. 6161018 discloses an imaging device including carbon nanotubes as a photoelectric conversion material in a photoelectric conversion layer.

SUMMARY

In one general aspect, the techniques disclosed here feature an imaging device including a plurality of pixels. Each of the plurality of pixels includes a counter electrode that passes incident light, a pixel electrode that faces the counter electrode, and a photoelectric conversion layer that is located between the counter electrode and the pixel electrode and that includes carbon nanotubes. The plurality of pixels include a first pixel and a second pixel adjacent to the first pixel. The pixel electrode of the first pixel and the pixel electrode of the second pixel are isolated from each other. The photoelectric conversion layer is continuously provided between the first pixel and the second pixel. The carbon nanotubes included in the photoelectric conversion layer in at least one selected from the group consisting of the first pixel and the second pixel include at least one first carbon nanotube that satisfies A<B, where A denotes length of one carbon nanotube of the carbon nanotubes in a direction in which the pixel electrode of the first pixel and the pixel electrode of the second pixel are arranged and B denotes length of a gap between the pixel electrode of the first pixel and the pixel electrode of the second pixel.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 6C is a diagram illustrating another example of the planar layout of pixel electrodes for describing gaps between pixel electrodes;

FIGS. 8A and 8B are schematic cross-sectional diagrams for describing the flatness of a photoelectric conversion layer;

FIG. 11 is a block diagram illustrating the structure of a camera system according to a third embodiment.

DETAILED DESCRIPTION

Underlying Knowledge Forming Basis of Aspect of Present Disclosure

Figure 1:
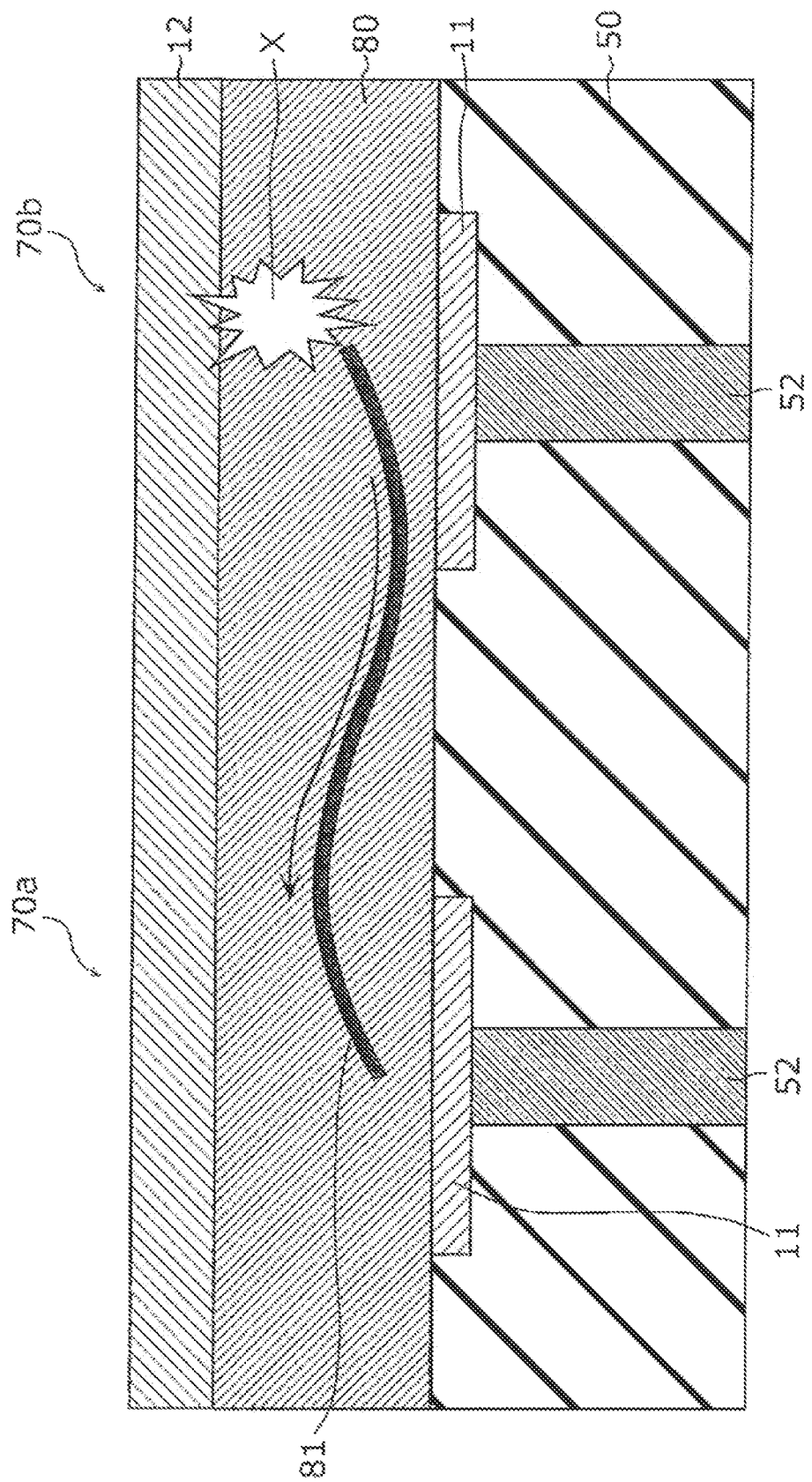
FIG. 1 is a schematic cross-sectional view of a photoelectric conversion layer including carbon nanotubes for describing a problem to be addressed.

As illustrated in a schematic cross-sectional view of FIG. 1, an imaging device that employs carbon nanotubes as a photoelectric conversion material for a photoelectric conversion layer includes a photoelectric conversion layer 80 including a long, slightly curved carbon nanotube 81. When a large amount of charge X that can cause leak current, such as dark current, is generated in the photoelectric conversion layer 80 of a pixel 70b, a pixel electrode 11 of the pixel 70b collects a large amount of charge, and a white color is output in an image as if bright light is incident. This phenomenon will be referred to as a "white" sport, and a pixel corresponding to a white spot will be referred to as a "white pixel" hereinafter. When the photoelectric conversion layer 80 does not include the carbon nanotube 81, only the pixel 70b is a white pixel. Since the carbon nanotube 81 is long as illustrated in FIG. 1 and the charge conductivity of the carbon nanotube 81 is high, however, the carbon nanotube 81 can undesirably introduce leak current based on charge generated in the pixel 70b into an adjacent pixel 70a, thereby causing a white spot in the pixel 70a, too. Because, unlike in the case of normal signal charge, the amount of charge that causes a white pixel is large, improvements need to be made in order to prevent the introduction of leak current into the adjacent pixel 70a, even if charge conductivity inside the pixel 70b is increased and generated charge is collected in the pixel electrode 11 of the pixel 70b or the like.

When a white pixel occurs, the white pixel can be corrected by detecting the white pixel and performing interpolation on the basis of outputs of adjacent pixels. When the photoelectric conversion layer 80 includes the carbon nanotube 81 as described above, however, white spots also occur in adjacent pixels also become white pixels, thereby spreading white pixels.

The present inventors have thus found that in the case of an imaging device including a photoelectric conversion layer that employs carbon nanotubes as a photoelectric conversion material, the quality of the imaging device decreases because the carbon nanotubes spread white pixels and make correction difficult. In the present disclosure, therefore, a high-quality imaging device that causes few white pixels even though the imaging device includes, above a silicon semiconductor substrate, a photoelectric conversion layer that employs carbon nanotubes as a photoelectric conversion material.

An outline of aspects of the present disclosure is as follows.

An imaging device according to an aspect of the present disclosure includes a plurality of pixels. Each of the plurality of pixels includes a counter electrode that passes incident light, a pixel electrode that faces the counter electrode, and a photoelectric conversion layer that is located between the counter electrode and the pixel electrode and that includes carbon nanotubes. The plurality of pixels include a first pixel and a second pixel adjacent to the first pixel. The pixel electrode of the first pixel and the pixel electrode of the second pixel are isolated from each other. The photoelectric conversion layer is continuously provided between the first pixel and the second pixel. The carbon nanotubes included in the photoelectric conversion layer in at least one selected from the group consisting of the first pixel and the second pixel include at least one first carbon nanotube that satisfies A<B, where A denotes length of one carbon nanotube of the carbon nanotubes in a direction in which the pixel electrode of the first pixel and the pixel electrode of the second pixel are arranged and B denotes length of a gap between the pixel electrode of the first pixel and the pixel electrode of the second pixel.

As a result, a photoelectric conversion layer in at least one of two adjacent pixels includes at least one carbon nanotube that satisfies A<B. That is, the photoelectric conversion layer includes a carbon nanotube that does not extend beyond a gap between pixel electrodes of the two adjacent pixels when viewed in plan. Even if a large amount of signal charge that can cause a white spot is generated due to a pixel defect or the like, the carbon nanotube does not introduce the large amount of signal charge into an adjacent pixel as leak current. Even if carbon nanotubes other than the foregoing carbon nanotube introduce leak current into the adjacent pixel, therefore, signal charge generated by the carbon nanotubes can be obtained on the basis of a difference in the amount of signal charge between an on state and an off state. As a result, spread of white pixels is suppressed by performing correction using signal charge obtained from the difference as signal charge for imaging. In addition, since the charge conductivity of carbon nanotubes is high, normal signal charge also moves through the carbon nanotubes, but since at least one carbon nanotube that satisfies A<B is included, signal charge is hardly introduced from an adjacent pixel. As a result, color mixing between two adjacent pixels is suppressed. A high-quality imaging device is thus achieved.

In addition, for example, number of pixels that include the photoelectric conversion layer including the at least one first carbon nanotube among the plurality of pixels may be 50% or more of total number of the plurality of pixels.

As a result, signal charge obtained by more than half the pixels on the basis of differences can be used as signal charge for imaging, and color mixing is also suppressed. A modulation transfer function (MTF), which indicates optical resolution of an imaging device, therefore, becomes 0.5 or higher. When the MTF is 0.5 or higher, straight lines can be recognized through image processing, for example, and a high-quality imaging device can be achieved.

In addition, for example, number of pixels that include the photoelectric conversion layer including the at least one first carbon nanotube among the plurality of pixels may be 80% or more of total number of the plurality of pixels.

As a result, signal charge obtained by 80% or more of the pixels on the basis of differences can be used as signal charge for imaging, and color mixing is also suppressed. The image quality of the imaging device, therefore, becomes high enough to be able to use the imaging device as a focal plane array.

In addition, for example, number of pixels that include the photoelectric conversion layer including the at least one first carbon nanotube among the plurality of pixels may be 90% or more of total number of the plurality of pixels.

As a result, signal charge obtained by 90% or more of the pixels on the basis of differences can be used as signal charge for imaging, and color mixing is also suppressed. The MTF, which indicates optical resolution of an imaging device, therefore, becomes 0.9 or higher. High resolution, therefore, is maintained without performing post-processing such as image processing, thereby achieving a higher-quality imaging device.

In addition, for example, the at least one first carbon nanotube may include a plurality of first carbon nanotubes, and percentage of the plurality of first carbon nanotubes in the carbon nanotubes included in the photoelectric conversion layer in all the plurality of pixels may be 50% or more.

As a result, when the photoelectric conversion layer includes the same number of carbon nanotubes in each of the pixels, the number of pixels that include the photoelectric conversion layer including at least one carbon nanotube that satisfies A<B becomes 50% or more of the pixels, thereby easily achieving the imaging device that produces the above-described effect.

In addition, for example, the at least one first carbon nanotube may include a plurality of first carbon nanotubes, and percentage of the plurality of first carbon nanotubes in the carbon nanotubes included in the photoelectric conversion layer in all the plurality of pixels may be 80% or more.

As a result, when the photoelectric conversion layer includes the same number of carbon nanotubes in each of the pixels, the number of pixels that include the photoelectric conversion layer including at least one carbon nanotube that satisfies A<B becomes 80% or more of the pixels, thereby easily achieving the imaging device that produces the above-described effect.

In addition, for example, the at least one first carbon nanotube may include a plurality of first carbon nanotubes, and percentage of the plurality of first carbon nanotubes in the carbon nanotubes included in the photoelectric conversion layer in all the plurality of pixels may be 90% or more.

As a result, when the photoelectric conversion layer includes the same number of carbon nanotubes in each of the pixels, the number of pixels that include the photoelectric conversion layer including at least one carbon nanotube that satisfies A<B becomes 90% or more of the pixels, thereby easily achieving the imaging device that produces the above-described effect.

In addition, for example, the photoelectric conversion layer may have a first part located over the pixel electrode of the first pixel in plan view and a second part located between the pixel electrode of the first pixel and the pixel electrode of the second pixel in plan view, the at least one first carbon nanotube may include first carbon nanotubes, and the second part may include more first carbon nanotubes than the first part.

As a result, even when the percentage of carbon nanotubes that satisfy A<B in the photoelectric conversion layer remains the same, carbon nanotubes that are not long enough to extend beyond a gap between pixel electrodes of adjacent pixels when viewed in plan tend to exist in the photoelectric conversion layer between the pixel electrodes of the adjacent pixels when viewed in plan. Spread of white pixels to adjacent pixels and color mixing between adjacent pixels, therefore, are suppressed more effectively.

In addition, for example, the carbon nanotubes included in the photoelectric conversion layer in at least one selected from the group consisting of the first pixel and the second pixel may include at least one second carbon nanotube that satisfies A<(B/2).

As a result, the photoelectric conversion layer in at least one of the pixels includes at least one carbon nanotube that satisfies A<(B/2). Even when regions within which corresponding pixel electrodes of adjacent pixels collect signal charge extend to the center of a gap between the pixel electrodes of the adjacent pixels, therefore, the photoelectric conversion layer includes a carbon nanotube that does not introduce leak current or the like from the regions within which the corresponding pixel electrodes of the adjacent pixels collect signal charge. Consequently, spread of white pixels and color mixing between adjacent pixels are suppressed.

In addition, for example, the carbon nanotubes included in the photoelectric conversion layer in at least one selected from the group consisting of the first pixel and the second pixel may include at least one third carbon nanotube that satisfies C<B, where a direct distance between two farthest points on one carbon nanotube of the carbon nanotubes is denoted by C.

As a result, the photoelectric conversion layer includes at least one carbon nanotube that does not extend across two adjacent pixels regardless of a direction in which carbon nanotubes are oriented in the photoelectric conversion layer. Spread of white pixels to adjacent pixels and color mixing between adjacent pixels, therefore, are suppressed, thereby easily achieving a high-quality imaging device.

In addition, for example, the carbon nanotubes included in the photoelectric conversion layer in at least one selected from the group consisting of the first pixel and the second pixel may include at least one fourth carbon nanotube that satisfies C<(B/2).

As a result, the photoelectric conversion layer in at least one of the pixels includes at least one carbon nanotube that satisfies C<(B/2). Even when regions within which corresponding pixel electrodes of adjacent pixels collect signal charge extend to the center of a gap between the pixel electrodes of the adjacent pixels, therefore, the photoelectric conversion layer includes a carbon nanotube that does not introduce leak current or the like from the regions within which the corresponding pixel electrodes of the adjacent pixels collect signal charge, regardless of a direction in which carbon nanotubes are oriented in the photoelectric conversion. Consequently, spread of white pixels and color mixing between adjacent pixels are suppressed, thereby easily achieving a high-quality imaging device.

In addition, for example, an imaging device according to another aspect of the present disclosure includes pixels and a barrier. Each of the pixels includes a counter electrode that passes incident light, a pixel electrode that faces the counter electrode, and a photoelectric conversion layer that is located between the counter electrode and the pixel electrode and that includes carbon nanotubes. The pixels include a first pixel and a second pixel adjacent to the first pixel. The pixel electrode of the first pixel and the pixel electrode of the second pixel are isolated from each other. The barrier is arranged in the photoelectric conversion layer and located between the pixels in plan view. The barrier has a first portion and a second portion adjacent to the first portion with the pixel electrode disposed between the first portion and the second portion. The carbon nanotubes included in the photoelectric conversion layer in one of the pixels include at least one carbon nanotube that satisfies A<D, where A denotes length of one carbon nanotube of the carbon nanotubes in a direction in which the pixel electrode of the first pixel and the pixel electrode of the second pixel are arranged and D denotes length of a gap between the first portion of the barrier and the second portion of the barrier. The imaging device may include a plurality of barriers.

As a result, since the photoelectric conversion layer includes a barrier that sandwiches the pixel electrode, movement of signal charge between adjacent pixels is suppressed, thereby suppressing color mixing between the adjacent pixels. In addition, since carbon nanotubes are shorter than a gap between two portions of the barrier, the carbon nanotubes hardly stick on upper surface of the barrier, thereby promoting an effect of preventing color mixing. In addition, the carbon nanotubes hardly get over the barrier, which improves the flatness of the upper surface of the barrier. The flatness of a counter electrode and the like formed over the barrier also improves, thereby reducing irregularity in sensitivity. A high-quality imaging device, therefore, is achieved.

Embodiments of the present disclosure will be described hereinafter with reference to the drawings. The present disclosure is not limited to the following embodiments. The following embodiments may be modified as necessary without deviating from a scope within which advantageous effects of the present disclosure are produced. Furthermore, an embodiment may be combined with another embodiment. In the following description, the same or similar components will be given the same reference numerals, and redundant description thereof might be omitted.

Terms indicating relationships between elements, such as "equal to each other", terms indicating shapes of elements, such as "square" and "circle", and ranges of values herein are not exact expressions but approximate expressions that can include errors of, say, several percent.

Terms "above" and "below" herein do not refer to upward (vertically above) and downward (vertically below) in absolute spatial recognition but are defined by relative positional relationships based on order of stacking of layers in a multilayer structure. The terms "above" and "below" will be used not only when two components are arranged in proximity to each other with another component provided therebetween but also when two components are arranged in contact with each other.

First Embodiment

Circuit Configuration of Imaging Device

First, the circuit configuration of an imaging device according to a first embodiment will be described with reference to FIG. 2.

Figure 2:
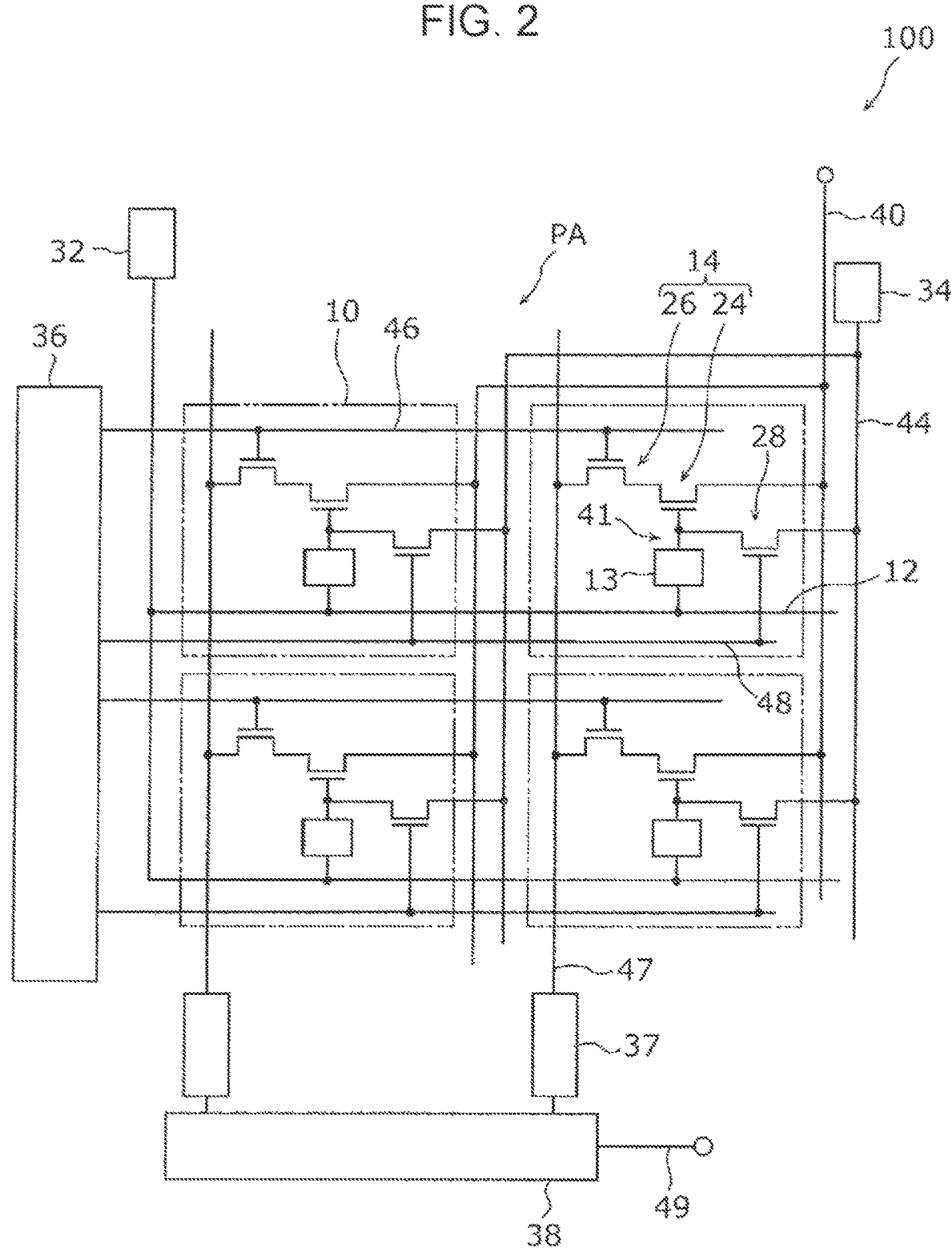
FIG. 2 is a circuit diagram illustrating the circuit configuration of an imaging device according to a first embodiment.

FIG. 2 is a schematic diagram illustrating an exemplary circuit configuration of the imaging device according to the present embodiment. An imaging device 100 illustrated in FIG. 2 includes a pixel array PA including pixels 10 arranged in two dimensions. FIG. 2 schematically illustrates an example in which the pixels 10 are arranged in a 2×2 matrix. The number and arrangement of pixels 10 of the imaging device 100 are not limited to the example illustrated in FIG. 2. For example, the imaging device 100 may be a line sensor in which pixels 10 are arranged in a line, instead.

Each of the pixels 10 includes a photoelectric conversion unit 13 and a signal detection circuit 14. As described later with reference to the drawings, the photoelectric conversion unit 13 includes a photoelectric conversion layer sandwiched between two electrodes facing each other. The photoelectric conversion unit 13 receives incident light and generates a signal. The photoelectric conversion unit 13 need not be an independent element for each of the pixels 10, and a part of the photoelectric conversion unit 13, for example, may be shared by two or more pixels 10. The signal detection circuit 14 detects a signal generated by the photoelectric conversion unit 13. In this example, the signal detection circuit 14 includes a signal detection transistor 24 and an address transistor 26. The signal detection transistor 24 and the address transistor 26 are typically field-effect transistors (FETs). Here, n-channel metal-oxide-semiconductor field-effect transistors (MOSFETs) are used as an example of the signal detection transistor 24 and the address transistor 26. Transistors such as the signal detection transistor 24, the address transistor 26, and a reset transistor 28, which will be described later, each include a control terminal, an input terminal, and an output terminal. The control terminal is, for example, a gate. The input terminal is either a drain or a source, for example, and may be, for example, the drain. The output terminal is another of the drain and the source and may be, for example, the source.

As schematically illustrated in FIG. 2, the control terminal of the signal detection transistor 24 is electrically connected to the photoelectric conversion unit 13. Signal charge generated by the photoelectric conversion unit 13 is accumulated in a charge accumulation node 41 between the gate of the signal detection transistor 24 and the photoelectric conversion unit 13. Here, the signal charge is holes or electrons. The charge accumulation node 41 is an example of a charge accumulation unit and also called a "floating diffusion node". The charge accumulation node 41 will also be referred to as a "charge accumulation region" herein. Details of the structure of the photoelectric conversion unit 13 will be described later.

The photoelectric conversion unit 13 of each of the pixels 10 is also connected to a counter electrode 12. The counter electrode 12 is connected to a voltage supply circuit 32. The voltage supply circuit 32 is also called a "counter electrode supply circuit". The voltage supply circuit 32 is configured to be able to supply a variable voltage. During the operation of the imaging device 100, the voltage supply circuit 32 supplies a certain voltage to the photoelectric conversion unit 13 via the counter electrode 12. The voltage supply circuit 32 is not limited to a certain power supply circuit. The voltage supply circuit 32 may be a circuit that generates the certain voltage or a circuit that converts a voltage supplied from another power supply into the certain voltage, instead.

The voltage supplied from the voltage supply circuit 32 to the photoelectric conversion unit 13 switches between different voltages to control a start and an end of accumulation of signal charge from the photoelectric conversion unit 13 to the charge accumulation node 41. Alternatively, this function can be achieved by controlling a voltage of the charge accumulation node 41 or a voltage of a pixel electrode, which will be described later. In other words, in the present embodiment, an operation of an electronic shutter is performed by switching the voltage supplied from the voltage supply circuit 32 to the photoelectric conversion unit 13 or an initial voltage of the charge accumulation node 41 or the pixel electrode. An example of the operation of the imaging device 100 will be described later. In the configuration illustrated in FIG. 2, the charge accumulation node 41 and the pixel electrode are connected to each other and have the same potential.

The pixels 10 are each connected to a power supply line 40 used to supply a power supply voltage VDD. As illustrated in FIG. 2, the input terminal of the signal detection transistor 24 is connected to the power supply line 40. When the power supply line 40 functions as a source follower power supply, the signal detection transistor 24 amplifies a signal generated by the photoelectric conversion unit 13 and outputs the amplified signal.

The input terminal of the address transistor 26 is connected to the output terminal of the signal detection transistor 24. The output terminal of the address transistor 26 is connected to one of vertical signal lines 47 provided for columns of the pixel array PA in one-to-one correspondence. The control terminal of the address transistor 26 is connected to an address control line 46. An output of the signal detection transistor 24 can be selectively read by a corresponding vertical signal line 47 by controlling potential of the address control line 46.

In the example illustrated in FIG. 2, the address control line 46 is connected to a vertical scanning circuit 36. The vertical scanning circuit 36 is also called a "row scanning circuit". The vertical scanning circuit 36 applies a certain voltage to the address control lines 46 to select, in units of rows, the pixels 10 arranged in each of rows. As a result, reading of signals from the selected pixels 10 and resetting of the charge accumulation nodes 41 are performed.

The vertical signal lines 47 are main signal lines for transferring pixel signals from the pixel array PA to peripheral circuits. Column signal processing circuits 37 are connected to the vertical signal lines 47. The column signal processing circuits 37 are also called "row signal accumulation circuits". The column signal processing circuits 37 perform, for example, noise suppression signal processing, which is typified by correlated double sampling, and analog-to-digital (A/D) conversion. As illustrated in FIG. 2, the column signal processing circuits 37 are provided for the columns of the pixels 10 in one-to-one correspondence. A horizontal signal reading circuit 38 is connected to the column signal processing circuits 37. The horizontal signal reading circuit 38 is also called a "column scanning circuit". The horizontal signal reading circuit 38 sequentially reads signals from the column signal processing circuits 37 and outputs the signals to a horizontal common signal line 49.

The pixels 10 each include a reset transistor 28. As with the signal detection transistor 24 and the address transistor 26, for example, the reset transistor 28 is an FET. In the following description, an example in which an n-channel MOSFET is used as the reset transistor 28 will be described unless otherwise specified. As illustrated in FIG. 2, the reset transistor 28 is connected between a reset voltage line 44 for supplying a reset voltage Vr and the charge accumulation node 41. The control terminal of the reset transistor 28 is connected to a reset control line 48. Potential of the charge accumulation node 41 can be reset to the reset voltage Vr by controlling potential of the reset control line 48. In this example, the reset control line 48 is connected to the vertical scanning circuit 36. The pixels 10 arranged in each of the rows, therefore, can be reset in units of rows by applying a certain voltage to the reset control lines 48 using the vertical scanning circuit 36.

In this example, the reset voltage line 44 for supplying the reset voltage Vr to the reset transistor 28 is connected to a reset voltage source 34. The reset voltage source 34 is also called a "reset voltage supply circuit". The reset voltage source 34 may be configured to be able to supply the certain reset voltage Vr to the reset voltage line 44 during the operation of the imaging device 100 and, as with the voltage supply circuit 32, is not limited to a certain power supply circuit. The voltage supply circuit 32 and the reset voltage source 34 may be parts of the same voltage supply circuit or may be separate voltage supply circuits. One or both of the voltage supply circuit 32 and the reset voltage source 34 may be a part of the vertical scanning circuit 36. Alternatively, a counter electrode voltage from the voltage supply circuit 32 and/or the reset voltage Vr from the reset voltage source 34 may be supplied to the pixels 10 through the vertical scanning circuit 36.

The power supply voltage VDD of the signal detection circuit 14 may be used as the reset voltage Vr, instead. In this case, a voltage supply circuit (not illustrated in FIG. 2) that supplies a power supply voltage to the pixels 10 and the reset voltage source 34 can be integrated with each other. Because the power supply line 40 and the reset voltage line 44 can also be integrated with each other, wiring in the pixel array PA can be simplified. When the reset voltage Vr is different from the power supply voltage VDD supplied by the signal detection circuit 14, however, the imaging device 100 can be controlled more flexibly.

Cross-Sectional Structure of Pixels

Next, the cross-sectional structure of the pixels 10 of the imaging device 100 according to the present embodiment will be described with reference to FIG. 3.

Figure 3:
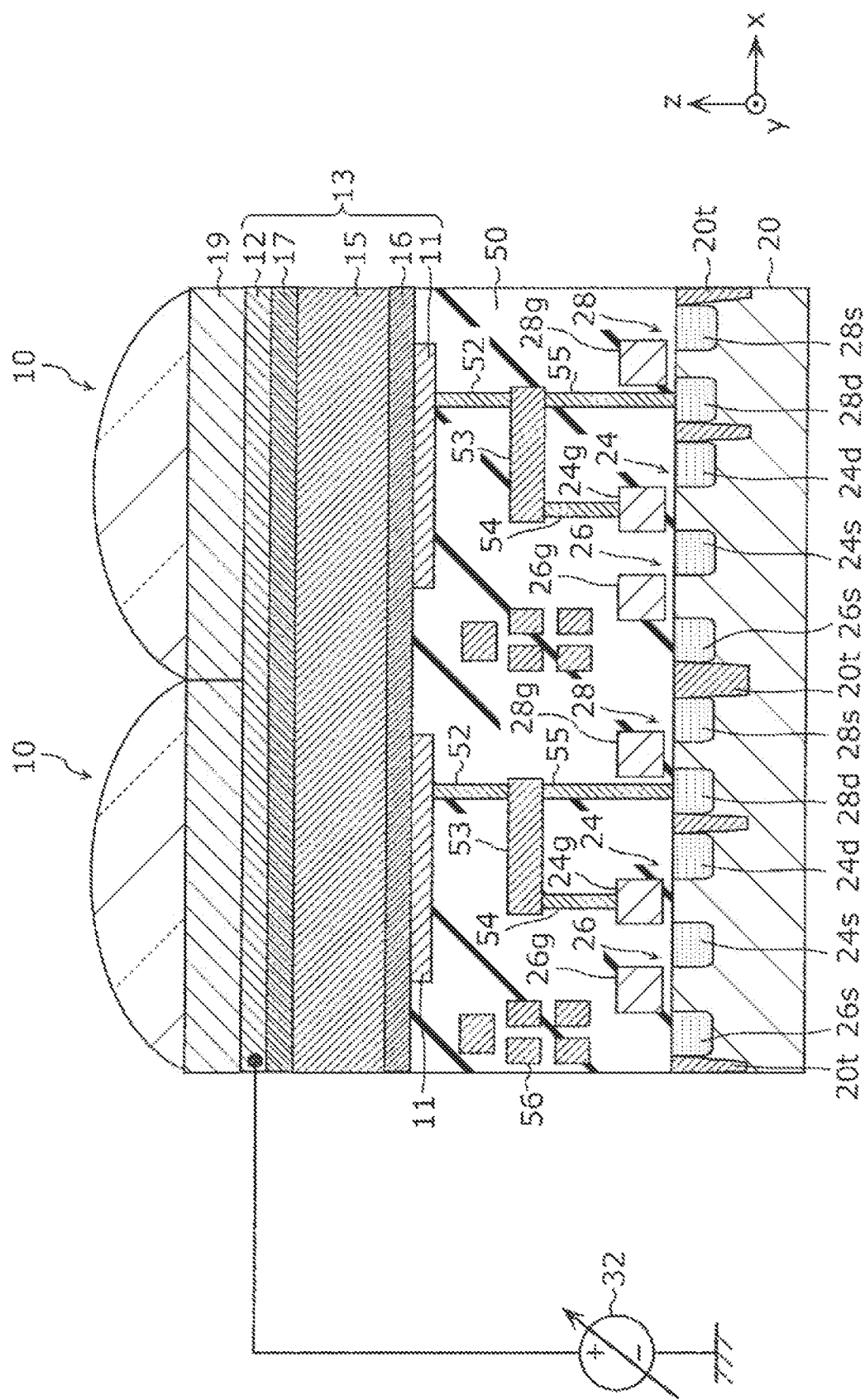
FIG. 3 is a schematic diagram illustrating a cross-sectional structure of two adjacent pixels in the imaging device according to the first embodiment.

FIG. 3 is a schematic diagram illustrating a cross-sectional structure of two adjacent of the pixels 10 illustrated in FIG. 2. The two adjacent pixels 10 illustrated in FIG. 3 have the same structure. One of the two adjacent pixels 10 will be described hereinafter. The two adjacent pixels 10 may have partly different structures. In the structure illustrated in FIG. 3, the signal detection transistor 24, the address transistor 26, and the reset transistor 28 are formed on a semiconductor substrate 20. The semiconductor substrate 20 is not limited to a substrate entirely composed of a semiconductor. The semiconductor substrate 20 may be an insulating substrate for which a semiconductor layer is provided on a surface on a side where photosensitive region is formed, instead. An example in which a p-type silicon (Si) substrate is used as the semiconductor substrate 20 will be described hereinafter.

The semiconductor substrate 20 includes impurity regions 26s, 24s, 24d, 28d, and 28s and element isolation regions 20t for electrically isolating the pixels 10 with one another. The impurity regions 26s, 24s, 24d, 28d, and 28s are n-type regions. An element isolation region 20t is also provided between the impurity regions 24d and 28d. The element isolation regions 20t are formed, for example, by implanting an acceptor through ion implantation under certain implantation conditions.

The impurity regions 26s, 24s, 24d, 28d, and 28s are, for example, an impurity diffusion layer formed in the semiconductor substrate 20. As schematically illustrated in FIG. 3, the signal detection transistor 24 includes the impurity regions 24s and 24d and a gate electrode 24g. The gate electrode 24g is composed of a conductive material. The conductive material is, for example, polysilicon that has conductivity as a result of impurity doping, but may be a metal material, instead. The impurity regions 24s and 24d function, for example, as a source region and a drain region of the signal detection transistor 24, respectively. A channel region of the signal detection transistor 24 is formed between the impurity regions 24s and 24d.

Similarly, the address transistor 26 includes impurity regions 26s and 24s and a gate electrode 26g connected to one of the address control lines 46. The gate electrode 26g is composed of a conductive material. The conductive material is, for example, polysilicon that has conductivity as a result of impurity doping, but may be a metal material, instead. In this example, the signal detection transistor 24 and the address transistor 26 are electrically connected to each other by sharing the impurity region 24s. The impurity region 24s functions, for example, as a drain region of the address transistor 26. The impurity region 26s functions, for example, as a source region of the address transistor 26. The impurity region 26s is connected to one of the vertical signal lines 47, which are not illustrated in FIG. 3. The impurity region 24s need not be shared by the signal detection transistor 24 and the address transistor 26. More specifically, the source region of the signal detection transistor 24 and the drain region of the address transistor 26 may be isolated from each other on the semiconductor substrate 20 and electrically connected to each other via wiring layers 56 provided in an interlayer insulation layer 50.

The reset transistor 28 includes impurity regions 28d and 28s and a gate electrode 28g connected to one of the reset control lines 48. The gate electrode 28g is composed, for example, of a conductive material. The conductive material is, for example, polysilicon that has conductivity as a result of impurity doping, but may be a metal material, instead. The impurity region 28s functions, for example, as a source region of the reset transistor 28. The impurity region 28s is connected to one of the reset voltage lines 44, which are not illustrated in FIG. 3. The impurity region 28d functions, for example, as a drain region of the reset transistor 28.

The interlayer insulation layer 50 is provided on the semiconductor substrate 20 in such a way as to cover the signal detection transistor 24, the address transistor 26, and the reset transistor 28. The interlayer insulation layer 50 is an example of a first insulation layer. The interlayer insulation layer 50 is composed, for example, of an insulating material such as silicon dioxide. As illustrated in FIG. 3, the wiring layers 56 are provided in the interlayer insulation layer 50. The wiring layers 56 are typically composed of a metal such as copper. The wiring layers 56 may include, for example, signal lines such as the vertical signal lines 47 or power supply lines as a part thereof. The number of insulation layers in the interlayer insulation layer 50 and the number of layers included in the wiring layers 56 provided in the interlayer insulation layer 50 may be set as desired and are not limited to the example illustrated in FIG. 3.

As illustrated in FIG. 3, a plug 52, a wire 53, and contact plugs 54 and 55 are also provided in the interlayer insulation layer 50. The wire 53 may be a part of the wiring layers 56.

The plug 52, the wire 53, and the contact plugs 54 and 55 are each composed of a conductive material. The plug 52 and the wire 53, for example, are composed of a metal such as copper. The contact plugs 54 and 55, for example, are composed of polysilicon that has conductivity as a result of impurity doping. The plug 52, the wire 53, and the contact plugs 54 and 55 may be composed of the same material or different materials.

The plug 52, the wire 53, and the contact plug 54 constitute at least a part of the charge accumulation node 41 between the signal detection transistor 24 and the photoelectric conversion unit 13. In the structure illustrated in FIG. 3, the gate electrode 24g of the signal detection transistor 24, the plug 52, the wire 53, the contact plugs 54 and 55, and the impurity region 28d, which is either the source region or the drain region of the reset transistor 28 function as a charge accumulation region for accumulating signal charge collected by a pixel electrode 11 of the photoelectric conversion unit 13 on the interlayer insulation layer 50.

More specifically, the pixel electrode 11 of the photoelectric conversion unit 13 is connected to the gate electrode 24g of the signal detection transistor 24 via the plug 52, the wire 53, and the contact plug 54. In other words, the gate of the signal detection transistor 24 is electrically connected to the pixel electrode 11. The pixel electrode 11 is also connected to the impurity region 28d via the plug 52, the wire 53, and the contact plug 55.

As the pixel electrode 11 collects signal charge, a voltage according to the amount of signal charge accumulated in the charge accumulation region is applied to the gate of the signal detection transistor 24. The signal detection transistor 24 amplifies the voltage. The voltage amplified by the signal detection transistor 24 is selectively read by the address transistor 26 as signal voltage.

The above-described photoelectric conversion unit 13 is arranged on the interlayer insulation layer 50. In other words, in the present embodiment, the pixels 10 constituting the pixel array PA illustrated in FIG. 2 are formed in and on the semiconductor substrate 20. The pixels 10 arranged in two dimensions when the semiconductor substrate 20 is viewed as a plan form a photosensitive region. The photosensitive region is also called a "pixel region". A distance between two adjacent pixels 10 illustrated in FIG. 3, that is, pixel pitch, may be, say, about 2 µm.

In a color filter layer 19 provided on the counter electrode 12 illustrated in FIG. 3, not only color filters that each achieve a transmittance corresponding to the wavelength of red, green, or blue visible light as in conventional imaging devices but also a bandpass filter or a longpass filter for ultraviolet light or near-infrared light may be used.

Configuration of Photoelectric Conversion Unit

A specific configuration of the photoelectric conversion unit 13 on the interlayer insulation layer 50 will be described hereinafter.

The photoelectric conversion unit 13 includes the pixel electrode 11 and a photoelectric conversion layer 15 provided between the pixel electrode 11 and the counter electrode 12. Furthermore, as illustrated in FIG. 3, an electron blocking layer 16, the photoelectric conversion layer 15, and an acceptor layer 17 are stacked in this order between the counter electrode 12 and the pixel electrode 11 of the photoelectric conversion unit 13 from a side of the pixel electrode 11. In this example, the counter electrode 12, the photoelectric conversion layer 15, the electron blocking layer 16, and the acceptor layer 17 are formed across two adjacent pixels 10. The counter electrode 12, the photoelectric conversion layer 15, the electron blocking layer 16, and the acceptor layer 17 may further extend to other pixels 10. The pixel electrode 11 is provided for each of two adjacent pixels 10. The pixel electrodes 11 of two adjacent pixels 10 are spatially isolated from each other so that the pixel electrodes 11 are electrically isolated from each other. The same holds for pixel electrodes 11 of other pixels 11 that are not illustrated in FIG. 3, that is, the pixel electrode 11 is provided for each of the pixels 10. At least the counter electrode 12, the photoelectric conversion layer 15, the electron blocking layer 16, or the acceptor layer 17 may be separately provided for each of the pixels 10.

The pixel electrode 11 is an electrode for reading signal charge generated by the photoelectric conversion unit 13. There is at least one pixel electrode 11 for each of the pixels 10. The pixel electrode 11 is electrically connected to the gate electrode 24g of the signal detection transistor 24 and the impurity region 28d.

The pixel electrode 11 is composed of a conductive material. The conductive material is, for example, a metal such as aluminum or copper, a metal nitride, or polysilicon that has conductivity as a result of impurity doping.

The counter electrode 12 is, for example, a transparent electrode composed of a transparent conductive material. The counter electrode 12 is arranged on a side of the photoelectric conversion layer 15 where light is incident. Light that has passed through the counter electrode 12, therefore, is incident on the photoelectric conversion layer 15. Light detected by the imaging device 100 is not limited to light within a wavelength range of visible light. For example, the imaging device 100 may detect infrared light or ultraviolet light. The wavelength range of visible light is, for example, 380 nm to 780 nm.

A term "transparent" herein means that an object passes at least a part of light within a wavelength range to be detected and that an object need not pass light over the entirety of the wavelength range of visible light. A term "light" herein refers to electromagnetic waves in general including infrared light and ultraviolet light.

The counter electrode 12 is composed, for example, of a transparent conducting oxide (TCO) such as ITO, IZO, AZO, FTO, $SnO_2$, $TiO_2$, or $ZnO_2$.

As described with reference to FIG. 2, the counter electrode 12 is connected to the voltage supply circuit 32. As illustrated in FIG. 3, the counter electrode 12 is formed across two adjacent pixels 10. The voltage supply circuit 32, therefore, can collectively apply a desired counter electrode voltage to the two adjacent pixels 10 via the counter electrode 12. The counter electrode 12 may also extend to pixels 10 that are not illustrated in FIG. 3. The counter electrode 12 may be separately provided for each of the two adjacent pixels 10 and the other pixels 10 that are not illustrated in FIG. 3, instead, insofar as the voltage supply circuit 32 can apply a desired counter electrode voltage.

When the voltage supply circuit 32 controls potential of the counter electrode 12 against potential of the pixel electrode 11, the pixel electrode 11 can collect, as signal charge, either holes or electrons of hole-electron pairs generated in the photoelectric conversion layer 15 as a result of photoelectric conversion. When holes are used as signal charge, for example, the pixel electrode 11 can selectively collect the holes by making the potential of the counter electrode 12 higher than that of the pixel electrode 11. A case where holes are used as signal charge will be described hereinafter. Electrons may be used as signal charge, instead. In this case, the potential of the counter electrode 12 may be made lower than that of the pixel electrode 11. When an appropriate bias voltage is applied between the counter electrode 12 and the pixel electrode 11, the pixel electrode 11, which faces the counter electrode 12, collects either positive or negative charge generated in the photoelectric conversion layer 15 as a result of photoelectric conversion.

The photoelectric conversion layer 15 receives incident light and generates hole-electron pairs. The photoelectric conversion layer 15 includes carbon nanotubes. The carbon nanotubes absorb light incident on the photoelectric conversion layer 15 within a certain wavelength range and generates hole-electron pairs. Chirality of the carbon nanotubes for achieving wavelength selectivity may be different between the pixels 10 or the same in all the pixels 10.

With a structure in which the photoelectric conversion layer 15 is stacked above a circuit substrate, as in the case of the imaging device 100 according to the present embodiment, the photoelectric conversion unit 13 can be composed of a material different from Si or the like, which is used for the circuit substrate, unlike in the case of a complementary metal-oxide-semiconductor (CMOS) image sensor. An effect of achieving imaging that does not depend on wavelength characteristics of the circuit substrate can be produced.

The electron blocking layer 16 has a function of suppressing movement of electrons, which are opposite the signal charge, from an adjacent pixel electrode 11 to the photoelectric conversion layer 15 while transporting holes, which are the signal charge generated in the photoelectric conversion layer 15, to the electrode. As a result, dark current is suppressed in the imaging device 100. A material of the electron blocking layer 16 is a p-type semiconductor, for example, and, more specifically, may be a semiconductor composed of an inorganic material such as a nickel oxide, a copper oxide, a chromium oxide, a cobalt oxide, a titanium oxide, or a zinc oxide, but is not limited to these. The p-type semiconductor may be composed of an inorganic material obtained by doping a metal oxide or a metal nitride with an impurity, instead. More specifically, the p-type semiconductor may be, for example, a film obtained by doping a silicon oxide with phosphorus, arsenic, antimony, or the like, instead. The material of the electron blocking layer 16 may be a semiconductor composed of an organic material such as a hole-transporting organic compound.

The acceptor layer 17 has a function of receiving electrons, which are opposite the signal charge, from the photoelectric conversion layer 15 and transporting the electrons to the counter electrode 12. A material of the acceptor layer 17 is, for example, a fullerene or a fullerene derivative.

The photoelectric conversion layer 15 and the acceptor layer 17 are in planar heterojunction. Electrons are extracted at an interface between the photoelectric conversion layer 15 and the acceptor layer 17, and holes remaining in the photoelectric conversion layer 15 are collected on a side of the pixel electrode 11 because of the applied voltage.

In the present embodiment, a structure has been described in which holes are accumulated from the photoelectric conversion layer 15 and read as signal charge and the electron blocking layer 16 for reducing dark current is provided. When electrons are accumulated and read as signal charge, on the other hand, a hole blocking layer may be used instead of the electron blocking layer 16, and a donor layer may be used instead of the acceptor layer 17. The hole blocking layer has a function of suppressing movement of holes from an adjacent pixel electrode 11 to the photoelectric conversion layer 15 while transporting electrons generated in the photoelectric conversion layer 15 to the electrode. The donor layer has a function of receiving holes from the photoelectric conversion layer 15 and transporting the holes to the counter electrode 12.

The photoelectric conversion unit 13 according to the present embodiment need not include the electron blocking layer 16 and the acceptor layer 17. If light incident on the photoelectric conversion layer 15 generates hole-electron pairs inside the carbon nanotubes and generated signal charge moves in a direction perpendicular to a circumferential direction of the carbon nanotubes, that is, a longitudinal direction of the carbon nanotubes, before the pixel electrode 11 stacked under the photoelectric conversion layer 15 collects the signal charge, color mixing with an adjacent pixel or a decrease in resolution can occur. This effect is significant especially when the acceptor layer 17 is not provided between the photoelectric conversion layer 15 and the pixel electrode 11. Because the length of the carbon nanotubes is limited in the present embodiment, details of which will be described later, color mixing with an adjacent pixel and a decrease in resolution can be suppressed, even if generated signal charge moves through the carbon nanotubes in the longitudinal direction of the carbon nanotubes.

Although a planar heterojunction structure, where the photoelectric conversion layer 15 is isolated from the acceptor layer 17, is employed in the example illustrated in FIG. 3, a photoelectric conversion layer having a bulk heterojunction structure, where the material of the photoelectric conversion layer 15 and the material of the acceptor layer 17 are mixed, may be employed, instead. When the bulk heterojunction structure is employed, charge extraction efficiency increases, which improves sensitivity.

Furthermore, in FIG. 3, a hole blocking layer, which restricts movement of holes, which are signal charge, may be provided under the counter electrode 12 in order to reduce dark current caused by hole injection from the counter electrode 12.

Next, details of the carbon nanotubes included in the photoelectric conversion layer 15 according to the present embodiment will be described.

Figure 4:
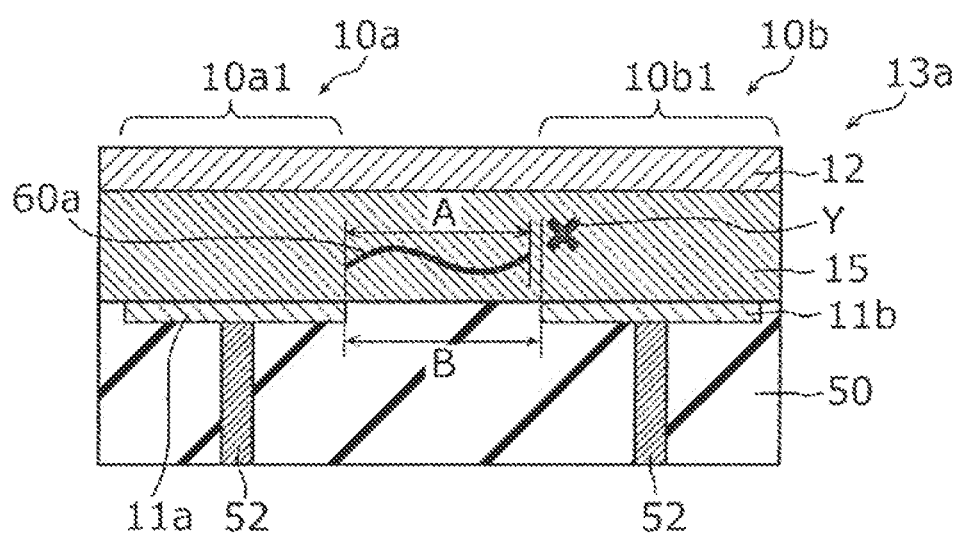
FIG. 4 is a schematic diagram illustrating a cross-sectional structure of a photoelectric conversion unit of the imaging device according to the first embodiment.

FIG. 4 is a schematic diagram illustrating a cross-sectional structure of a photoelectric conversion unit 13a of the imaging device 100 according to the present embodiment. Because FIG. 4 is intended for description of a carbon nanotube, only the photoelectric conversion layer 15 is provided between the counter electrode 12 and pixel electrodes 11a and 11b. A donor layer or an acceptor layer for extracting charge from the photoelectric conversion layer 15 and an electron blocking layer or a hole blocking layer for reducing dark current caused by injection of charge opposite signal charge from the pixel electrode 11 are not illustrated. FIG. 4 also illustrates a part of the interlayer insulation layer 50. Although following schematic diagrams illustrating cross-sectional structures of a photoelectric conversion unit do not illustrate components other than part of the photoelectric conversion unit and an interlayer insulation layer, the components other than the photoelectric conversion unit are the same as those of each of the pixel 10 illustrated in FIG. 3.

FIG. 4 illustrates two adjacent pixels 10a and 10b. The pixel 10a is an example of a first pixel, and the pixel 10b is an example of a second pixel.

As illustrated in FIG. 4, the two adjacent pixels 10a and 10b include a counter electrode 12 that passes incident light, pixel electrodes 11a and 11b facing the counter electrode 12, and a photoelectric conversion layer 15 sandwiched between the counter electrode 12 and the pixel electrodes 11a and 11b. More specifically, the counter electrode 12 and the photoelectric conversion layer 15 are formed across the two adjacent pixels 10a and 10b.

Each of the two adjacent pixels 10a and 10b also includes the pixel electrodes 11a and 11b, respectively. The interlayer insulation layer 50 is embedded between the pixel electrodes 11a and 11b. That is, the pixel electrodes 11a and 11b of the two adjacent pixels 10a and 10b are isolated from each other by an insulating material of the interlayer insulation layer 50. FIG. 4 illustrates a case where the pixel electrode 11a of the pixel 10a collects signal charge within a collection region 10a1 and the pixel electrode 11b of the pixel 10b collects signal charge within a collection region 10b1.

The photoelectric conversion layer 15 in the pixels 10a and 10b include carbon nanotubes. FIG. 4 illustrates only one 60a of the carbon nanotubes and does not illustrate other carbon nanotubes. For example, carbon nanotubes may exist the photoelectric conversion layer 15 right above the pixel electrodes 11a and 11b.

When there is a pixel defect Y in the photoelectric conversion layer 15 in the pixel 10b, the pixel defect Y can be a source of charge such as dark current of room temperature thermal excitation that can cause a white spot. As illustrated in FIG. 4, length A of at least one carbon nanotube 60a in the photoelectric conversion layer 15 is, when viewed in plan, smaller than a length B of a gap between the pixel electrode 11a of the pixel 10a and the pixel electrode 11b of the pixel 10b in the imaging device 100 according to the present embodiment in order not to introduce leak current, such as dark current, caused by charge generated in the pixel defect Y into the pixel 10a. That is, the carbon nanotubes included in the photoelectric conversion layer 15 in the pixel 10a include at least one carbon nanotube that satisfies the length A<the length B. Since the carbon nanotube that satisfies the length A<the length B is short, the carbon nanotube does not extend beyond the length B of the gap between the pixel electrodes 11a and 11b when viewed in plan. The carbon nanotubes included in the photoelectric conversion layer 15 in the pixel 10a are carbon nanotubes that are at least partly included in the photoelectric conversion layer 15 in the pixel 10a.

The carbon nanotubes included in the photoelectric conversion layer 15 in the pixel 10b, too, may include at least one carbon nanotube that satisfies the length A<the length B.

Because a white spot occurs as a result of generation of a large amount of charge, it is difficult to prevent introduction of leak current into the adjacent pixel 10a by collecting generated charge in the pixel electrode 11b or the like. The pixel 10a according to the present embodiment, however, includes, in the photoelectric conversion layer 15, at least one carbon nanotube that satisfies the length A<the length B. Even if leak current, which can cause a white spot, is introduced from the adjacent pixel 10b because carbon nanotubes other than the foregoing carbon nanotube do not satisfy the length A<the length B, therefore, signal charge generated by the carbon nanotubes can be obtained on the basis of differences in the amount of signal charge between an on state and an off state. Even if the adjacent pixel 10b is a white pixel, an increase in the number of white pixels can be suppressed by performing correction using the signal charge obtained from the difference as signal charge for imaging. That is, since the carbon nanotubes included in the photoelectric conversion layer 15 in at least either the two adjacent pixels 10a and 10b include at least one carbon nanotube that satisfies the length A<the length B, spread of white pixels can be suppressed, thereby achieving a high-quality imaging device with few white pixels.

Because charge conductivity of carbon nanotubes is high, normal signal charge move through the carbon nanotubes. Since the carbon nanotubes in the photoelectric conversion layer 15 in the pixel 10a include at least one carbon nanotube that satisfies the length A<the length B, however, signal charge is hardly introduced from the adjacent pixel 10b. Color mixing between the adjacent pixels 10a and 10b can therefore be suppressed.

Since, as described above, leak current generated in the pixel 10b is not introduced into the adjacent pixel 10a in the imaging device 100 according to the present embodiment, white spots do not spread from the pixel 10b to adjacent pixels such as the pixel 10a. In addition, introduction of signal charge generated in the pixel 10b into the adjacent pixel 10a and the like can also be suppressed, that is, a decrease in resolution and color mixing can be suppressed.

The number of pixels that include the photoelectric conversion layer 15 including at least one carbon nanotube that satisfies the length A<the length B may be 50% or more of all the pixels 10. In this case, signal charge obtained by more than half the pixels 10 on the basis of differences can be used as signal charge for imaging, and color mixing is suppressed. An MTF, which indicates optical resolution of an imaging device, therefore, becomes 0.5 or higher. The MTF is an index that falls within a range of 0 to 1. The higher the MTF, the higher the optical resolution. When the MTF is 0.5 or higher, straight lines can be recognized through image processing, for example, thereby achieving a high-quality imaging device can be achieved.

Alternatively, the number of pixels that include the photoelectric conversion layer 15 including at least one carbon nanotube that satisfies the length A<the length B may be 80% or more of all the pixels 10. In this case, signal charge obtained by more than 80% of the pixels 10 on the basis of differences can be used as signal charge for imaging, and color mixing is suppressed. The image quality of the imaging device 100, therefore, becomes high enough to be able to use the imaging device 100 as a focal plane array.

Alternatively, the number of pixels that include the photoelectric conversion layer 15 including at least one carbon nanotube that satisfies the length A<the length B may be 90% or more of all the pixels 10. In this case, signal charge obtained by more than 90% of the pixels 10 on the basis of differences can be used as signal charge for imaging, and color mixing is suppressed. The MTF, which indicates the resolution of an imaging device, becomes 0.9 or higher. As a result, high resolution is maintained without performing post-processing such as image processing, thereby achieving a higher-quality imaging.

The percentage of carbon nanotubes that satisfy the length A<the length B in the photoelectric conversion layer 15 in all the pixels 10 may be 50% or more. The percentage refers to a ratio of the number of carbon nanotubes that satisfy the length A<the length B to the total number of carbon nanotubes. In this case, when the photoelectric conversion layer 15 includes substantially the same number of carbon nanotubes in each of the pixels 10, the number of pixels in which the photoelectric conversion layer 15 includes at least one carbon nanotube that satisfies the length A<the length B becomes 50% or more of the total number of pixels 10, thereby easily an imaging device that produces the above effect. Furthermore, when the carbon nanotubes are uniformly dispersed in the photoelectric conversion layer 15, the percentage of pixels including at least one carbon nanotube that satisfies the length A<the length B is expected to increase further, thereby achieving a high-quality imaging device.

Alternatively, the percentage of carbon nanotubes that satisfy the length A<the length B in the photoelectric conversion layer 15 in all the pixels 10 may be 80% or more. In this case, when the photoelectric conversion layer 15 includes substantially the same number of carbon nanotubes in each of the pixels 10, the number of pixels in which the photoelectric conversion layer 15 includes at least one carbon nanotube that satisfies the length A<the length B becomes 80% or more of the total number of pixels 10, thereby easily achieving an imaging device that produces the above advantageous effect. Furthermore, when the carbon nanotubes are uniformly dispersed in the photoelectric conversion layer 15, the percentage of pixels including at least one carbon nanotube that satisfies the length A<the length B is expected to increase further, thereby achieving a high-quality imaging device.

Alternatively, the percentage of carbon nanotubes that satisfy the length A<the length B in the photoelectric conversion layer 15 in all the pixels 10 may be 90% or more. In this case, when the photoelectric conversion layer 15 includes substantially the same number of carbon nanotubes in each of the pixels 10, the number of pixels in which the photoelectric conversion layer 15 includes at least one carbon nanotube that satisfies the length A<the length B becomes 90% or more of the total number of pixels 10, thereby easily achieving an imaging device that produces the above advantageous effect. Furthermore, when the carbon nanotubes are uniformly dispersed in the photoelectric conversion layer 15, the percentage of pixels including at least one carbon nanotube that satisfies the length A<the length B is expected to increase further, thereby achieving a high-quality imaging device.

A second part of the photoelectric conversion layer 15 located between the pixel electrode 11a of the pixel 10a and the pixel electrode 11b of the pixel 10b when viewed in plan may include more carbon nanotubes that satisfy the length A<the length B than a first part of the photoelectric conversion layer 15 located over the pixel electrode 11a of the pixel 10a when viewed in plan. In this case, even when the percentage of carbon nanotubes that satisfy the length A<the length B in the photoelectric conversion layer 15 remains the same, carbon nanotubes having the length A shorter than the length B tend to exist in the photoelectric conversion layer 15 between the pixel electrode 11a of the pixel 10a and the pixel electrode 11b of the pixel 10b when viewed in plan. Spread of white pixels to adjacent pixels and color mixing between adjacent pixels, therefore, can be further suppressed. By forming the photoelectric conversion layer 15 using inks including carbon nanotubes having different lengths, for example, the carbon nanotubes having different lengths can be provided for the photoelectric conversion layer 15 over the pixel electrode 11a when viewed in plan and the photoelectric conversion layer 15 between the pixel electrodes 11a and 11b when viewed in plan.

The length of carbon nanotubes will be described hereinafter. FIGS. 5A to 5D are schematic diagrams illustrating the length of carbon nanotubes according to the present embodiment. The length A of a carbon nanotube 60 herein does not refer to an effective length between two ends of the carbon nanotube 60 but, as illustrated in FIG. 5A, refers to the length of the carbon nanotube 60 in an arrangement direction, which is a direction in which pixel electrodes 11c and 11d are arranged when viewed in plan. In an example illustrated in FIG. 5A, an arrangement direction of the pixel electrodes 11c and 11d and a longitudinal direction of the carbon nanotube 60 are the same, and a direct distance between the two ends of the carbon nanotube 60 and the length A are the same. When the longitudinal direction of the carbon nanotube 60 is inclined with respect to the arrangement direction of the pixel electrodes 11c and 11d as illustrated in FIG. 5B, the length A is shorter than the direct distance between the two ends of the carbon nanotube 60.

The photoelectric conversion layer 15 according to the present embodiment is fabricated, for example, by applying ink including carbon nanotubes to an upper surface of the pixel electrode 11 and the like. The length A of the carbon nanotubes may be achieved by adjusting the effective length of the carbon nanotubes included in the ink used to fabricate the photoelectric conversion layer 15 or, as illustrated in FIGS. 5A and 5B, by controlling the longitudinal direction of the carbon nanotubes with respect to the arrangement direction of pixel electrodes in the photoelectric conversion layer 15 without adjusting the effective length of the carbon nanotubes. Although the length A changes depending on the longitudinal direction of the carbon nanotube 60 when viewed in plan in FIGS. 5A and 5B, the length A decreases, too, when viewed in cross section as the longitudinal direction of the carbon nanotube 60 is inclined more steeply with respect to the arrangement direction of the pixel electrodes.

The inclination of the carbon nanotubes in the photoelectric conversion layer 15 with respect to an arrangement direction of pixel electrodes can be controlled using various methods. For example, the inclination can be simply controlled on the basis of spin coating speed or viscosity at a time when the ink including the carbon nanotubes is applied. More specifically, when the spin coating speed is high when the ink including the carbon nanotubes is dropped onto the upper surface of the pixel electrode 11 and the like, the longitudinal direction of the carbon nanotubes tends to be perpendicular to a stacking direction. When the viscosity of the ink including the carbon nanotubes is high or the spin coating speed is low, on the other hand, the longitudinal direction of the carbon nanotubes tends to align with the stacking direction. Whether the spin coating speed is high or low is determined in relation to a reference state on the basis of the viscosity of the ink including the carbon nanotubes and a target film thickness.

The effective length of the carbon nanotubes may be adjusted by selecting available carbon nanotubes having a target length or by obtaining longer carbon nanotubes and then cutting the carbon nanotubes through stirring or the like. Because common carbon nanotubes are a mixture of carbon nanotubes of various lengths, carbon nanotubes having a target length may be extracted through filtration or the like. Alternatively, carbon nanotubes having a target length may be synthesized using a known method such as microplasma chemical vapor deposition (CVD), a carbon penetration method, or surface decomposition of SiC.

Figure 5C:
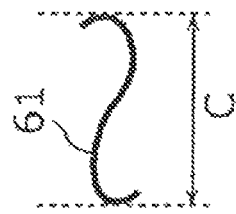
FIGS. 5A to 5D are schematic diagrams illustrating the length of carbon nanotubes according to the first embodiment.

In the imaging device 100 according to the present embodiment, not the length A of the carbon nanotube 60 but, as illustrated in FIG. 5C, a direct distance C between two points on the carbon nanotube 60 spatially farthest from each other may be shorter than the length B in FIG. 4. That is, the carbon nanotubes included in the photoelectric conversion layer 15 in the pixel 10a illustrated in FIG. 4 may include at least one carbon nanotube that satisfies the direct distance C<the length B. In this case, the photoelectric conversion layer 15 includes at least one carbon nanotube that does not extend across two adjacent pixels regardless of a direction in which the carbon nanotubes are oriented in the photoelectric conversion layer 15. Spread of white pixels to adjacent pixels and color mixing between adjacent pixels, therefore, are suppressed, thereby easily achieving a high-quality imaging device.

Figure 5D:
Figure 5A:
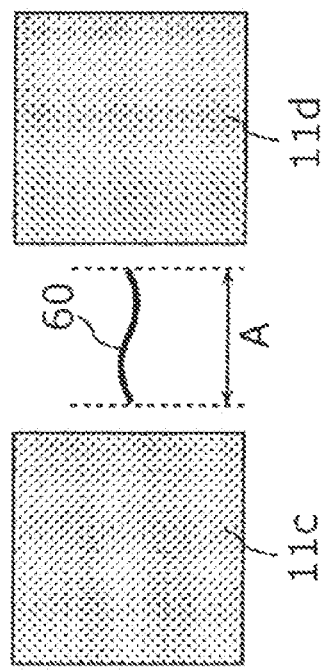
Figure 5B:
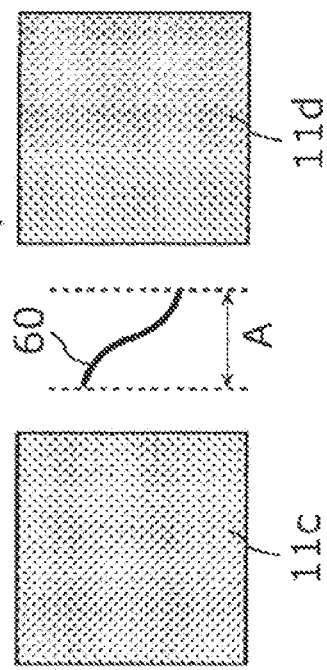

In an example illustrated in FIG. 5C, a direct distance between the two ends of the carbon nanotube 60 and the direct distance C between the two spatially farthest points are the same. When a carbon nanotube 61 has a curved shape where two ends are coming closer to each other as illustrated in FIG. 5D, on the other hand, the direct distance C between two spatially farthest points is longer than a distance between the two ends of the carbon nanotube 61.

Figure 6A:
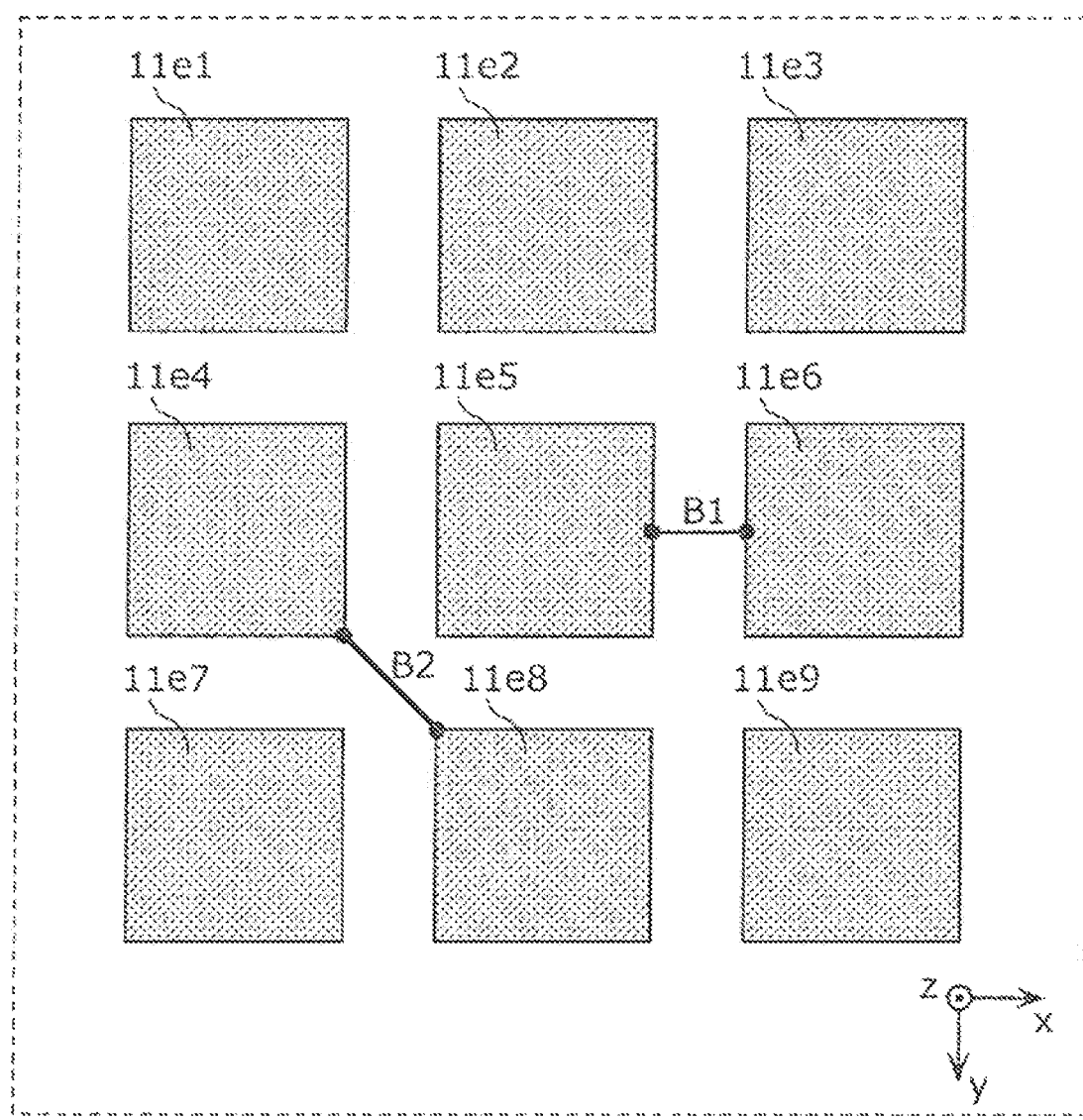
FIG. 6A is a diagram illustrating a planar layout of pixel electrodes of the imaging device according to the first embodiment.

Next, the length B of a gap between two adjacent pixels will be described. FIG. 6A is a diagram illustrating a planar layout of pixel electrodes of the imaging device 100 according to the present embodiment. As illustrated in FIG. 6A, pixel electrodes 11e1 to 11e9 are arranged in a matrix. When pixel electrodes are arranged in a matrix, a length B1 of a gap between pixel electrodes of two pixels adjacent to each other in a horizontal or vertical direction, such as pixel electrodes 11e5 and 11e6, is the smallest. A length B2 of a gap between pixel electrodes of two pixels adjacent to each other at an angle of 45 degrees, such as pixel electrodes 11e4 and 11e8, is greater than the length B1. In the case of arrangement of pixel electrodes where the length of a gap varies depending on positions, such as in the case of the pixel electrodes 11e4 and 11e8 of two pixels adjacent to each other at an angle of 45 degrees, a "gap" refers to a gap between closest points on the two adjacent pixel electrodes.

The length B of the gap that contributes to reduction in color mixing and the like illustrated in FIG. 4 may be the length B1 of the gap between the pixel electrodes 11e5 and 11e6, which are arranged adjacent to each other in the horizontal direction illustrated in FIG. 6A, or the length B2 of the gap between the pixel electrodes 11e4 and 11e8, which are arranged adjacent to each other at an angle of 45 degrees illustrated in FIG. 6A, depending on a position at which the carbon nanotubes are provided.

Furthermore, when optical filters such as color filters, bandpass filters, or longpass filters are provided above the pixel electrodes 11e5 and 11e6, respectively, and optical characteristics of the optical filters provided above the pixel electrodes 11e5 and 11e6 are the same, color mixing is reduced compared to when optical filters having different optical characteristics are provided above adjacent pixel electrodes, even if the length A of carbon nanotubes is greater than the length B1 of the gap between the pixel electrodes 11e5 and 11e6. When optical filters having different optical characteristics are provided above pixel electrodes, on the other hand, the length A of carbon nanotubes is desirably set in accordance with the length of a gap between the pixel electrodes of pixels for which the optical filters having different optical characteristics are provided. When optical filters having different optical characteristics are provided above the pixel electrodes 11e4 and 11e8, for example, the length A of carbon nanotubes may be set in accordance with the length B2 of the gap between the pixel electrodes 11e4 and 11e8, which are adjacent to each other at an angle of 45 degrees.

A planar shape of pixel electrodes is not particularly limited. For example, pixel electrodes may be circles or regular polygons such as regular hexagons or regular octagons. The arrangement of pixel electrodes is not particularly limited, either. For example, pixel electrodes may be arranged in a diagonal direction.

Figure 6B:
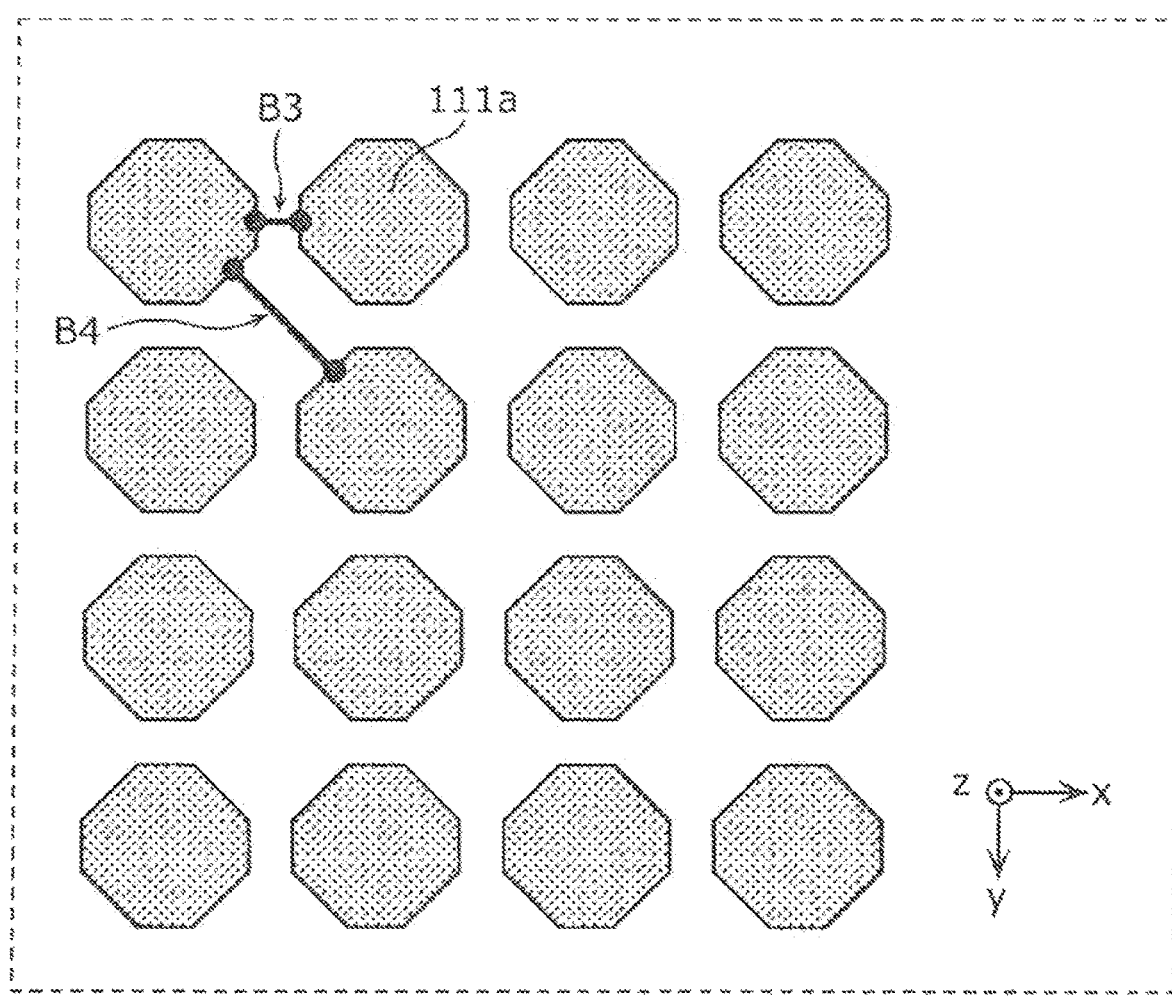
FIG. 6B is a diagram illustrating an example of a planar layout of pixel electrodes for describing gaps between pixel electrodes.
Figure 6D:
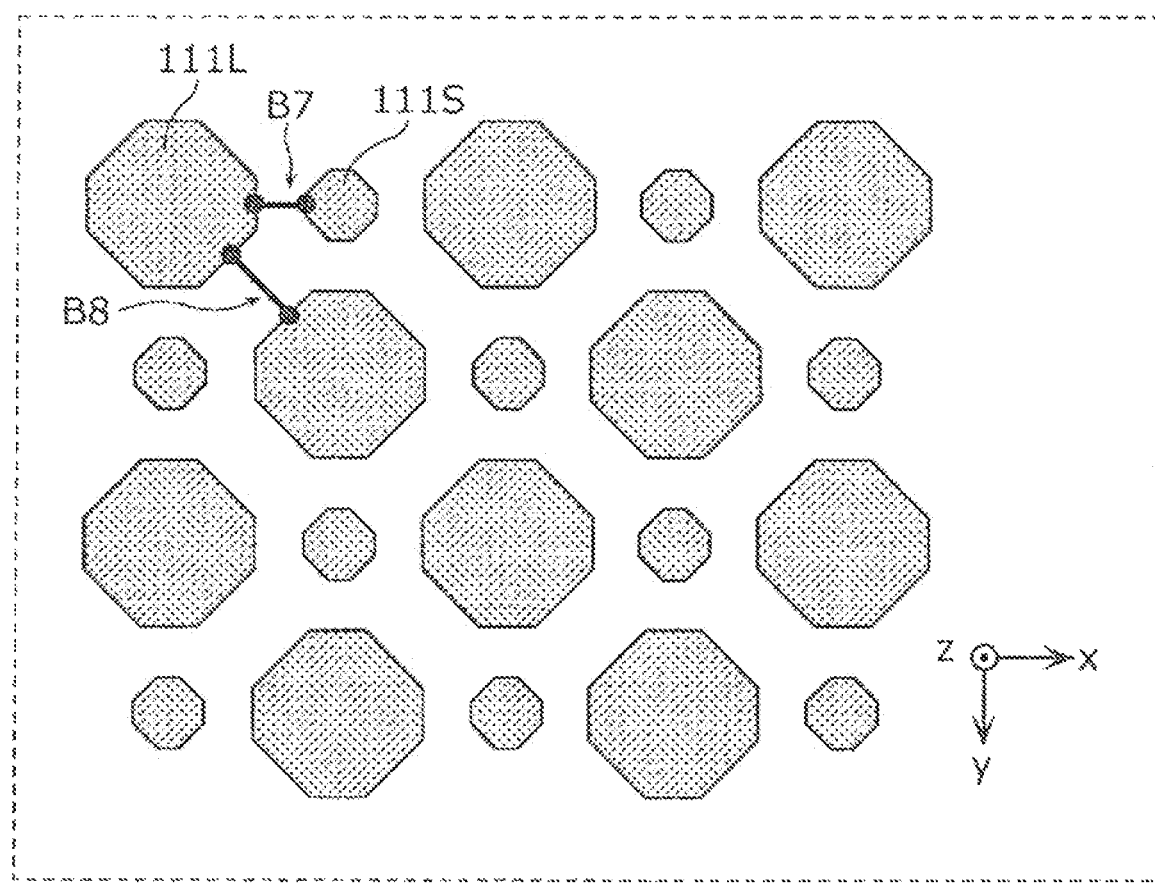
FIG. 6D is a diagram illustrating another example of the planar layout of pixel electrodes for describing gaps between pixel electrodes.

FIGS. 6B, 6C, and 6D are diagrams illustrating examples of the planar layout of pixel electrodes for describing the lengths of gaps between the pixel electrodes. When pixel electrodes 111a having a planar shape of a regular octagon are arranged in a matrix as illustrated in FIG. 6B, for example, a length B4 of a gap between pixel electrodes 111a adjacent to each other at an angle of 45 degrees is greater than a length B3 of a gap between pixel electrodes 111a adjacent to each other in the horizontal direction. When pixel electrodes 111b having a planar shape of a regular octagon are arranged in such a way as to form lines at an angle of 45 degrees as illustrated in FIG. 6C, for example, a length B6 of a gap between pixel electrodes 111b adjacent to each other in the horizontal direction is greater than a length B5 of a gap between pixel electrodes 111b adjacent to each other at an angle of 45 degrees. When larger pixel electrodes 111L and smaller pixel electrodes 111S having a planar shape of a regular octagon are alternately arranged in a matrix as illustrated in FIG. 6D, for example, a length B8 of a gap between pixel electrodes 111L adjacent to each other at an angle of 45 degrees is greater than a length B7 of a gap between pixel electrodes 111L and 111S adjacent to each other in the horizontal direction.

As illustrated in FIGS. 6A to 6D, at least one of the lengths B1 to B8 in directions in which pixel electrodes are arranged is thus used as the length of gaps between pixel electrodes. A length in any arrangement direction may be used in accordance with a position at which carbon nanotubes are provided.

Figure 7A:
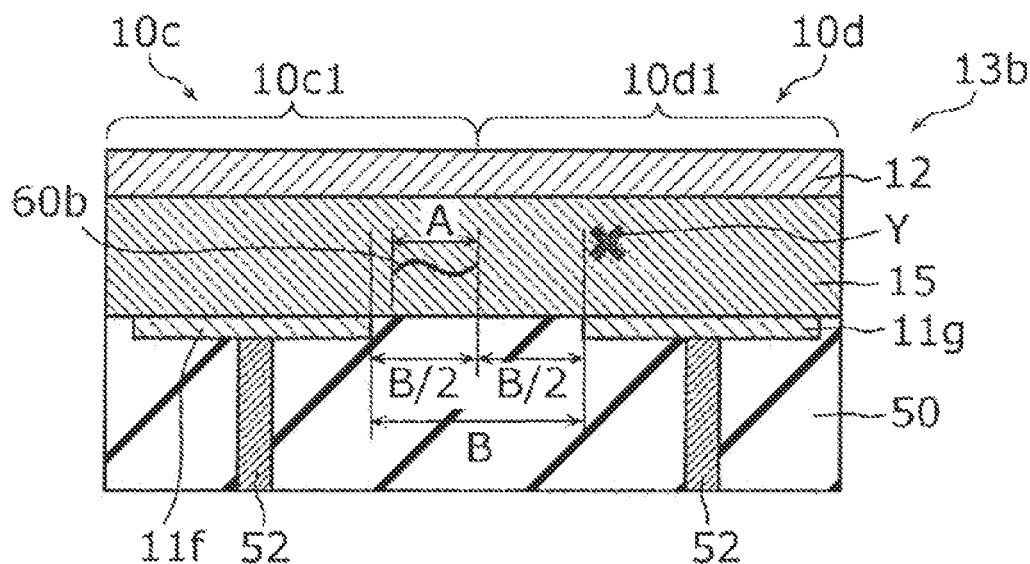
FIGS. 7A and 7B are schematic diagrams illustrating cross-sectional structures of photoelectric conversion units of the imaging device according to another example of the first embodiment.
Figure 7B:
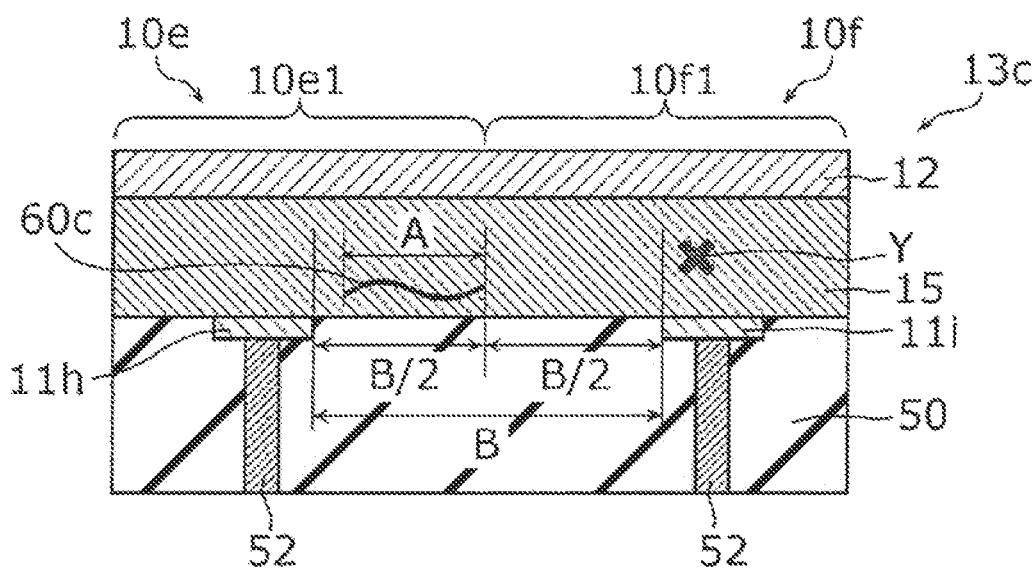

Next, an imaging device in another example of the present embodiment will be described. FIGS. 7A and 7B are schematic diagrams illustrating cross-sectional structures of photoelectric conversion units of the imaging device in the other example of the present embodiment. FIG. 7A illustrates a photoelectric conversion unit 13b formed for two adjacent pixels 10c and 10d. FIG. 7B illustrates a photoelectric conversion unit 13c formed for two adjacent pixels 10e and 10f. FIGS. 7A and 7B also illustrate a part of the interlayer insulation layer 50. The photoelectric conversion units 13b and 13c illustrated in FIGS. 7A and 7B, respectively, are different from the photoelectric conversion unit 13a illustrated in FIG. 4 in that collection regions, in which pixel electrodes collect signal charge, are larger. The pixels 10c and 10e are other examples of the first pixel, and the pixels 10d and 10f are other examples of the second pixel. FIGS. 7A and 7B illustrate only carbon nanotubes 60b and 60c, respectively, and do not illustrate other carbon nanotubes.

The size of regions in which pixel electrodes collect signal charge generated in a photoelectric conversion layer can be adjusted to a certain degree with electric fields generated by voltages applied between a counter electrode and the pixel electrodes. In the case of the pixels 10c and 10d illustrated in FIG. 7A, a pixel electrode 11f of the pixel 10c collects signal charge in a collection region 10c1, and a pixel electrode 11g of the pixel 10d collects signal charge in a collection region 10d1. In the photoelectric conversion unit 13b, a boundary between the collection regions 10c1 and 10d1 is a middle point of the length B of a gap between the pixel electrodes 11f and 11g. At this time, reset voltages, which are initial potentials of the pixel electrodes 11f and 11g, are assumed to be the same.

In order not to introduce, into the adjacent pixel 10c, leak current caused by charge generated at a pixel defect Y above the pixel electrode 11g of the pixel 10d, therefore, carbon nanotubes included in the photoelectric conversion layer 15 in the pixel 10c desirably include, as illustrated in FIG. 7A, at least one carbon nanotube 60b whose length A is smaller than half (B/2) the length B of the gap between the pixel electrodes 11f and 11g. In this case, since the photoelectric conversion layer 15 in the pixel 10c includes the carbon nanotube 60b that does not introduce leak current or the like into the photoelectric conversion layer 15 in the pixel 10c from the photoelectric conversion layer 15 in the adjacent pixel 10d over the pixel electrode 11g, spread of white pixels and color mixing between adjacent pixels are suppressed. The carbon nanotubes included in the photoelectric conversion layer 15 in the pixel 10c may include at least one carbon nanotube whose direct distance C is smaller than half (B/2) the length B of the gap between the pixel electrodes 11f and 11g.

In order to increase an allowable length A of carbon nanotubes, the size of pixel electrodes 11h and 11i may, as illustrated in FIG. 7B, be made smaller than that of the pixel electrodes 11f and 11g illustrated in FIG. 7A. In general, when pixel electrodes in a multilayer imaging device are reduced in size, collection regions for signal charge are also reduced in size, which causes a decrease in sensitivity. In the case of the multilayer imaging device including carbon nanotubes in a photoelectric conversion layer, however, the collection regions for signal charge can be made larger than the pixel electrodes because the carbon nanotubes are long. As illustrated in FIG. 7B, therefore, the length A of a carbon nanotube 60c may be greater than the width of the pixel electrodes 11h and 11i. The length A of the carbon nanotube 60c may be smaller than half (B/2) the length B of a gap between the pixel electrodes 11h and 11i. The width of the pixel electrodes 11h and 11i may be smaller than the length B of the gap between the pixel electrodes 11h and 11i or smaller than half (B/2) the length B of the gap between the pixel electrodes 11h and 11i.

Next, another effect due to the length of carbon nanotubes will be described. FIGS. 8A and 8B are schematic cross-sectional diagrams for describing the flatness of a photoelectric conversion layer. FIG. 8A illustrates a case where a carbon nanotube 81a included in a photoelectric conversion layer 80a is relatively long. FIG. 8B illustrates a case where a carbon nanotube 60d included in the photoelectric conversion layer 15 is relatively short. When an imaging device that includes a photoelectric conversion layer including carbon nanotubes is fabricated, the density of carbon nanotubes in the photoelectric conversion layer may be increased by applying ink including carbon nanotubes two or more times or two or more layers in order to increase sensitivity. Since the carbon nanotubes dispersed in a solvent are rigid and long, a surface of the photoelectric conversion layer 80a including, as illustrated in FIG. 8A, the carbon nanotube 81a that is long with respect to the size of the pixel electrode 11 and the gap, that is, the carbon nanotube 81a that satisfies the length A>the length B, is undulating after a drying process. The cycle of undulations on the surface of the photoelectric conversion layer 80a is larger than pixel pitch, which can result in irregular sensitivity, that is, different levels of sensitivity are observed in different pixels. As illustrated in FIG. 8B, on the other hand, when the photoelectric conversion layer 15 includes a carbon nanotube 60d whose length A is smaller than the length B of a gap between adjacent pixel electrodes 11, the cycle of undulations on a surface of the photoelectric conversion layer 15 falls below the pixel pitch. As a result, irregularity in sensitivity between pixels can be reduced. Furthermore, when a direct distance C between two farthest points on the carbon nanotube 60d is smaller than the length B of the gap between adjacent pixel electrodes 11, the size of the undulations on the surface of the photoelectric conversion layer 15 is also reduced, thereby making it easier to stack a counter electrode and the like on the photoelectric conversion layer 15 flatly.

Second Embodiment

Next, a second embodiment will be described. The second embodiment is different from the first embodiment in that a photoelectric conversion layer includes a barrier. Differences from the first embodiment will be mainly described hereinafter, and description of common points is omitted or simplified.

Figure 9:
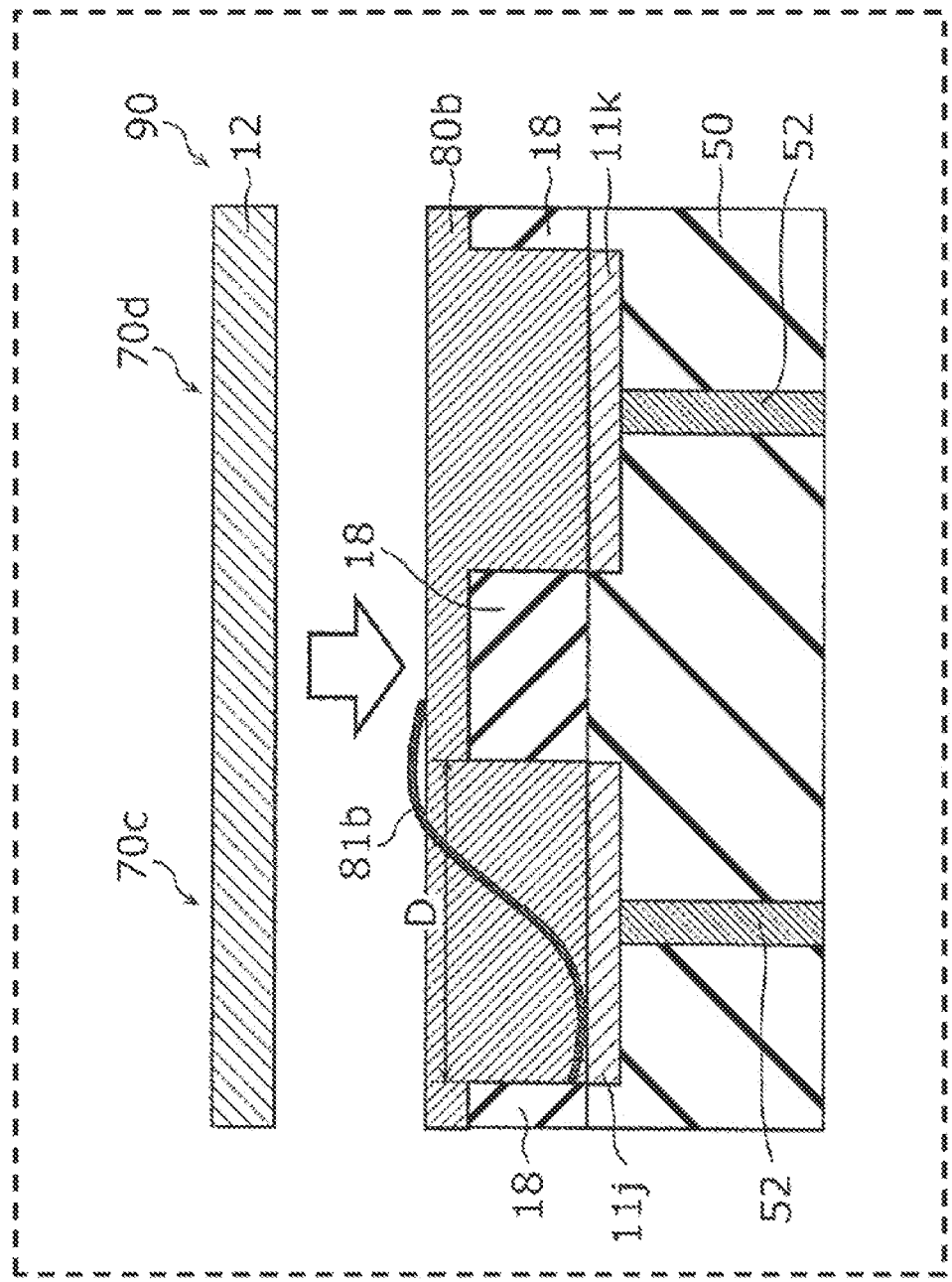
FIG. 9 is a schematic diagram illustrating a cross-sectional structure of a photoelectric conversion unit of an imaging device in a comparative example.

First, an imaging device in a first comparative example for describing the second embodiment will be described. FIG. 9 is a schematic diagram illustrating a cross-sectional structure of a photoelectric conversion unit 90 of the imaging device in the first comparative example. FIG. 9 illustrates two adjacent pixels 70c and 70d. In FIG. 9, a photoelectric conversion layer 80b and the counter electrode 12 are isolated from each other.

As illustrated in FIG. 9, the pixels 70c and 70d include the counter electrode 12 that passes incident light, pixel electrodes 11j and 11k that face the counter electrode 12, and the photoelectric conversion layer 80b sandwiched between the counter electrode 12 and the pixel electrodes 11j and 11k. The pixels 70c and 70d include separate pixel electrodes 11j and 11k, respectively.

The photoelectric conversion layer 80b includes carbon nanotubes. FIG. 9 only illustrates only one 81b of the carbon nanotubes and does not illustrate other carbon nanotubes.

A barrier 18 is provided in the photoelectric conversion layer 80b between, when viewed in plan, the pixels 70c and 70d and other pixels that are not illustrated in FIG. 9. The barrier 18 has portions that sandwich pixel electrodes such as the pixel electrodes 11j and 11k. The length A of a carbon nanotube 81b is greater than a length D of a gap between a first portion of a barrier 18 on the left of the pixel electrode 11j and a second portion of a barrier 18 on the right of the pixel electrode 11j. A plurality of barriers 18 may be provided in the photoelectric conversion layer 80b.

When a barrier 18 is provided for each pixel in order to avoid color mixing optically or electrically and the length A of the carbon nanotube 81b is greater than the length D of the gap between, when viewed in plan, the first portion of the barrier 18 on the left of the pixel electrode 11j and the second portion of the barrier 18 on the right of the pixel electrode 11j, the carbon nanotube 81b might get over the barrier 18 as illustrated in FIG. 9, thereby impairing the flatness of an upper surface of the barrier 18. In addition, the carbon nanotube 81b might stick on the upper surface of the barrier 18, thereby connecting the pixels 11j and 11k to each other and reducing an effect of preventing color mixing.

Figure 10:
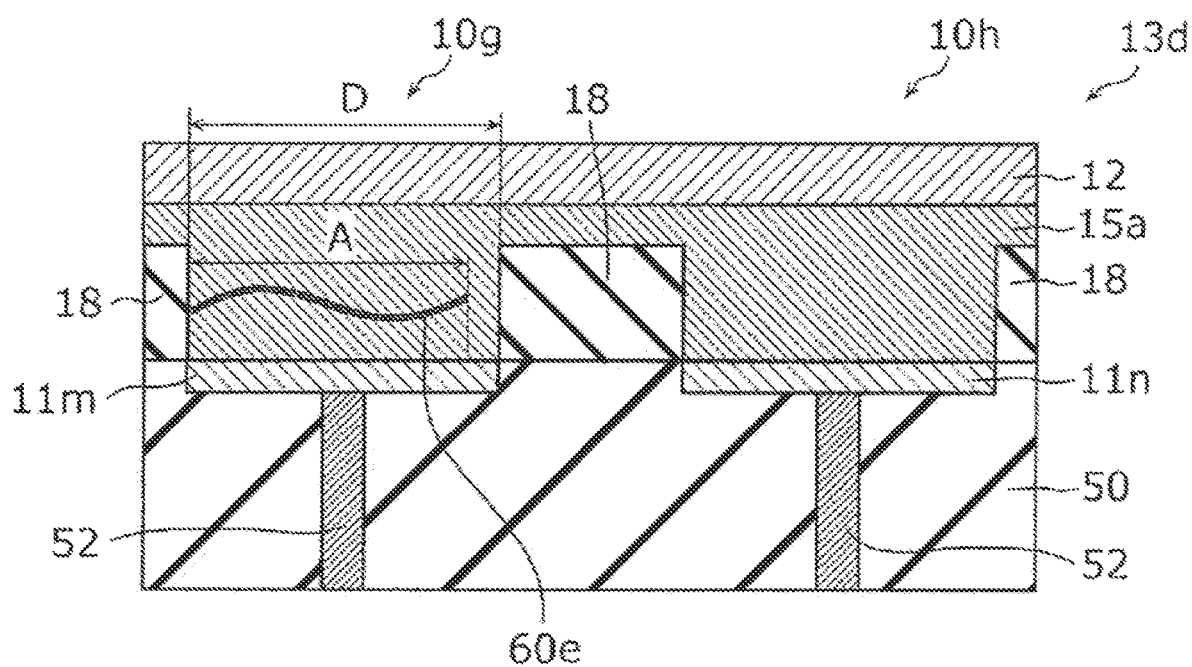
FIG. 10 is a schematic diagram illustrating a cross-sectional structure of a photoelectric conversion unit of an imaging device according to a second embodiment.

Next, the imaging apparatus according to the present embodiment will be described with reference to FIG. 10. FIG. 10 is a schematic diagram illustrating a cross-sectional structure of a photoelectric conversion unit 13d of the imaging device according to the present embodiment. FIG. 10 also illustrates a part of the interlayer insulation layer 50. FIG. 10 illustrates two adjacent pixels 10g and 10h.

As illustrated in FIG. 10, the pixels 10g and 10h include the counter electrode 12 that passes incident light, pixel electrodes 11m and 11n that face the counter electrode 12, respectively, and a photoelectric conversion layer 15a sandwiched between the counter electrode 12 and the pixel electrodes 11m and 11n. The counter electrode 12 and the photoelectric conversion layer 15a are formed across the two adjacent pixels 10g and 10h.

The pixels 10g and 10h include the separate pixel electrodes 11m and 11n, respectively. The interlayer insulation layer 50 is embedded between the two separate pixel electrodes 11m and 11n. That is, the pixel electrodes 11m and 11n of the two adjacent pixels 10g and 10h are isolated from each other by the insulating material of the interlayer insulation layer 50.

The photoelectric conversion layer 15a in the pixels 10g and 10h includes carbon nanotubes. FIG. 10 illustrates only one 60e of the carbon nanotubes and does not illustrate other carbon nanotubes.

A barrier 18 is provided in the photoelectric conversion layer 15a between, when viewed in plan, the pixels 10g and 10h and other pixels that are not illustrated in FIG. 10. The barrier 18 has portions that sandwich pixel electrodes such as the pixel electrodes 11m and 11n. A length D of a gap between a first portion of the barrier 18 on the left of the pixel electrode 11m and a second portion of the barrier 18 on the right of the pixel electrode 11m is smaller than the length A of a carbon nanotube 60e included in the photoelectric conversion layer 15a in the pixel 10g. That is, the carbon nanotubes included in the photoelectric conversion layer 15a in the pixel 10g include the carbon nanotube 60e that satisfies the length A<the length D. The carbon nanotubes included in the photoelectric conversion layer 15a in the pixel 10h, too, may include the carbon nanotube 60e that satisfies the length A<the length D. A plurality of barriers 18 may be provided in the photoelectric conversion layer 15a.

The barrier 18 is composed of a material whose resistance is higher than that of the photoelectric conversion layer 15a and whose charge conductivity is lower than that of the photoelectric conversion layer 15a. As a result, movement of signal charge between the adjacent pixels 10g and 10h is suppressed, thereby suppressing color mixing between the adjacent pixels 10g and 10h. The material of the barrier 18 may be a material whose resistivity is higher than that of the photoelectric conversion layer 15a including the carbon nanotubes. An insulating material such as $SiO_2$, AlO, or SiN is used for the barrier 18. The material of the barrier 18 is not limited to an insulating material insofar as the resistance of the material is higher than that of the photoelectric conversion layer 15a. One of various materials, therefore, may be selected in accordance with desired physical properties. When a flattening process such as chemical mechanical polishing (CMP) is provided after formation of the barrier 18 and the photoelectric conversion layer 15a, for example, the hardness of the barrier 18 and the photoelectric conversion layer 15a affects flatness. A material having an appropriate level of hardness, therefore, may be used for the barrier 18.

When a barrier 18 is provided for each pixel in order to avoid color mixing optically or electrically and the length A of the carbon nanotube 60e is shorter than the length D of the gap between, when viewed in plan, the first portion of the barrier 18 on the left of the pixel electrode 11m and the second portion of the barrier 18 on the right of the pixel electrode 11m, the carbon nanotube 60e hardly sticks on an upper surface of the barrier 18, thereby promoting the effect of preventing color mixing. In addition, the carbon nanotube 60e hardly gets over the barrier 18, thereby improving the flatness of upper surface of the barrier 18. As a result, the flatness of a layer formed over the photoelectric conversion layer 15a, that is, for example, the counter electrode 12, and evenness in the thickness of the layer improve. As a result of the improved flatness of the counter electrode 12, the thickness of the photoelectric conversion unit 13d at points in the pixels at which voltages are applied from the counter electrode 12 to the pixel electrodes 11m and 11n becomes even, thereby reducing irregularity in sensitivity. When the thickness of the counter electrode 12 varies between pixels, the resistance of the counter electrode 12 also varies. By making the thickness of the counter electrode 12 even, variation in a time constant is reduced, variation between imaging devices is reduced, and yields improve when the potential of the counter electrode 12 is changed in accordance with the operation of the imaging devices.

Although the photoelectric conversion layer 15a is formed even over the barrier 18 in FIG. 10, the photoelectric conversion layer 15a need not exist over the barrier 18 and the counter electrode 12 may be directly stacked on the barrier 18, instead. In addition, although the length D of the gap between the first portion of the barrier 18 on the left of the pixel electrode 11m and the second portion of the barrier 18 on the right of the pixel electrode 11m and the width of the pixel electrode 11m are the same in FIG. 10, the length D and the width of the pixel electrode 11m may be different from each other, instead. By making the length D greater than the width of the pixel electrode 11m, for example, functioning regions in the photoelectric conversion layer 15a are increased in size, thereby improving sensitivity and increasing the allowable length A of the carbon nanotube 60e. Although the length A of the carbon nanotube 60e is greater than the length of a gap between the pixel electrodes 11m and 11n in FIG. 10, the length A of the carbon nanotube 60e may be smaller than the length of the gap between the pixel electrodes 11m and 11n, instead.

As in the first embodiment, the number of pixels that include the photoelectric conversion layer 15a including at least one carbon nanotube that satisfies the length A<the length D may be 50% or more, 80% or more, or 90% or more of the total number of pixels.

In addition, the percentage of carbon nanotubes that satisfy the length A<the length D may be 50% or more, 80% or more, or 90% or more of all the carbon nanotubes included in the photoelectric conversion layer 15a in all the pixels.

Third Embodiment

Next, a third embodiment will be described.

FIG. 11 is a block diagram illustrating the structure of a camera system 600 according to the present embodiment. The camera system 600 includes a lens optical system 601, an imaging device 602, a system controller 603, and a camera signal processing unit 604.

The lens optical system 601 includes, for example, an autofocus lens, a zoom lens, and a diaphragm. The lens optical system 601 focuses light onto an imaging surface of the imaging device 602. Light that has passed the lens optical system 601 enters the photoelectric conversion unit 13 and is subjected to photoelectric conversion, thereby generating signal charge. A reading circuit 30 reads the signal charge and outputs an imaging signal. The imaging device 602 is the imaging device according to the first or second embodiment. The reading circuit 30 includes, for example, the circuits illustrated in FIG. 2.

The system controller 603 controls the entirety of the camera system 600. The system controller 603 can be achieved, for example, by a microcomputer.

The camera signal processing unit 604 functions as a signal processing circuit that processes signals output from the imaging device 602. The camera signal processing unit 604 performs processing such as gamma correction, color interpolation, spatial interpolation, auto white balance, distance measurement calculation, and wavelength information separation. The camera signal processing unit 604 is achieved, for example, by a digital signal processor (DSP).

With the camera system 600 according to the present embodiment, a high-quality imaging device can be achieved using the imaging device according to the first or second embodiment.

Other Embodiments

Although an imaging device according to one or more aspects have been described on the basis of some embodiments, the present disclosure is not limited to these embodiments. The scope of the present disclosure also includes modes obtained by modifying the embodiments in various ways conceivable by those skilled in the art and modes constructed by combining together components from different embodiments, insofar as the spirit of the present disclosure is not deviated from.

For example, the imaging device may also include pixels including a photoelectric conversion layer that does not include carbon nanotubes. In the imaging device, pixels that include a photoelectric conversion layer including carbon nanotubes and the pixels that include the photoelectric conversion layer that does not include carbon nanotubes may be arranged.

In addition, for example, a photoelectric conversion layer may include, as well as carbon nanotubes, another photoelectric conversion material such as an organic semiconductor and a semiconductor polymer for improving the dispersibility of the carbon nanotubes.

The imaging device in the present disclosure can be used for various camera systems and sensor systems such as medical cameras, monitoring cameras, vehicle cameras, distance measuring cameras, microscope cameras, drone cameras, and robot cameras.

What is claimed is:

1. An imaging device comprising:
   a plurality of pixels, wherein;
   each of the plurality of pixels includes a counter electrode that passes incident light, a pixel electrode that faces the counter electrode, and a photoelectric conversion layer that is located between the counter electrode and the pixel electrode and that includes carbon nanotubes,
   the plurality of pixels include a first pixel and a second pixel adjacent to the first pixel,
   the pixel electrode of the first pixel and the pixel electrode of the second pixel are isolated from each other,
   the photoelectric conversion layer is continuously provided between the first pixel and the second pixel, and
   the carbon nanotubes included in the photoelectric conversion layer in at least one selected from the group consisting of the first pixel and the second pixel include at least one first carbon nanotube that satisfies A<B, where A denotes length of one carbon nanotube of the carbon nanotubes in a direction in which the pixel electrode of the first pixel and the pixel electrode of the second pixel are arranged and B denotes length of a gap between the pixel electrode of the first pixel and the pixel electrode of the second pixel.

2. The imaging device according to claim 1,
   wherein number of pixels that include the at least one first carbon nanotube among the plurality of pixels is 50% or more of total number of the plurality of pixels.

3. The imaging device according to claim 1,
   wherein number of pixels that include the at least one first carbon nanotube among the plurality of pixels is 80% or more of total number of the plurality of pixels.

4. The imaging device according to claim 1,
   wherein number of pixels that include the at least one first carbon nanotube among the plurality of pixels is 90% or more of total number of the plurality of pixels.

5. The imaging device according to claim 1, wherein
   the at least one first carbon nanotube includes a plurality of first carbon nanotubes, and
   percentage of the plurality of first carbon nanotubes in the carbon nanotubes included in the photoelectric conversion layer in all the plurality of pixels is 50% or more.

6. The imaging device according to claim 1, wherein
   the at least one first carbon nanotube includes a plurality of first carbon nanotubes, and
   percentage of the plurality of first carbon nanotubes in the carbon nanotubes included in the photoelectric conversion layer in all the plurality of pixels is 80% or more.

7. The imaging device according to claim 1, wherein
   the at least one first carbon nanotube includes a plurality of first carbon nanotubes, and
   percentage of the plurality of first carbon nanotubes in the carbon nanotubes included in the photoelectric conversion layer in all the plurality of pixels is 90% or more.

8. The imaging device according to claim 1, wherein
   the photoelectric conversion layer has a first part located over the pixel electrode of the first pixel in plan view and a second part located between the pixel electrode of the first pixel and the pixel electrode of the second pixel in plan view,
   the at least one first carbon nanotube includes first carbon nanotubes, and
   the second part includes more first carbon nanotubes than the first part.

9. The imaging device according to claim 1,
   wherein the carbon nanotubes included in the photoelectric conversion layer in at least one selected from the group consisting of the first pixel and the second pixel include at least one second carbon nanotube that satisfies A<(B/2).

10. The imaging device according to claim 1,
    wherein the carbon nanotubes included in the photoelectric conversion layer in at least one selected from the group consisting of the first pixel and the second pixel include at least one third carbon nanotube that satisfies C<B, where a direct distance between two farthest points on one carbon nanotube of the carbon nanotubes is denoted by C.

11. The imaging device according to claim 10,
    wherein the carbon nanotubes included in the photoelectric conversion layer in at least one selected from the group consisting of the first pixel and the second pixel include at least one fourth carbon nanotube that satisfies C<(B/2).

12. An imaging device comprising:
    pixels; and
    a barrier, wherein
    each of the pixels includes a counter electrode that passes incident light, a pixel electrode that faces the counter electrode, and a photoelectric conversion layer that is located between the counter electrode and the pixel electrode and that includes carbon nanotubes,
    the pixels include a first pixel and a second pixel adjacent to the first pixel,
    the pixel electrode of the first pixel and the pixel electrode of the second pixel are isolated from each other,
    the barrier is arranged in the photoelectric conversion layer and located between the pixels in plan view,
    the barrier has a first portion and a second portion adjacent to the first portion with the pixel electrode disposed between the first portion and the second portion, and
    the carbon nanotubes included in the photoelectric conversion layer in one of the pixels include at least one carbon nanotube that satisfies A<D, where A denotes length of one carbon nanotube of the carbon nanotubes in a direction in which the pixel electrode of the first pixel and the pixel electrode of the second pixel are arranged and D denotes length of a gap between the first portion of the barrier and the second portion of the barrier.

* * * * *